(12) United States Patent
Hin

(10) Patent No.: US 8,058,098 B2
(45) Date of Patent: Nov. 15, 2011

(54) METHOD AND APPARATUS FOR FABRICATING A PLURALITY OF SEMICONDUCTOR DEVICES

(75) Inventor: Keong Bun Hin, Muar Johor (MY)

(73) Assignee: Infineon Technologies AG (DE)

( * ) Notice: Subject to any disclaimer, the term of this patent is extended or adjusted under 35 U.S.C. 154(b) by 871 days.

(21) Appl. No.: 11/684,849

(22) Filed: Mar. 12, 2007

(65) Prior Publication Data
US 2008/0224293 A1    Sep. 18, 2008

(51) Int. Cl.
H01L 21/44    (2006.01)

(52) U.S. Cl. .... 438/106; 438/123; 438/124; 257/E51.02

(58) Field of Classification Search .......... 438/106–127; 257/E51.02
See application file for complete search history.

(56) References Cited

U.S. PATENT DOCUMENTS

| | | | |
|---|---|---|---|
| 5,021,736 A | 6/1991 | Gonsalves et al. | |
| 5,741,530 A | 4/1998 | Tsunoda | |
| 6,033,933 A * | 3/2000 | Hur | 438/112 |
| 6,639,399 B2 | 10/2003 | Schroeder et al. | |
| 6,858,470 B1 | 2/2005 | Han et al. | |
| 7,009,286 B1 * | 3/2006 | Kirloskar et al. | 257/684 |
| 7,507,603 B1 * | 3/2009 | Berry et al. | 438/113 |
| 2002/0144908 A1 * | 10/2002 | Meulenkamp et al. | 205/118 |
| 2003/0153108 A1 * | 8/2003 | Durocher et al. | 438/26 |
| 2006/0060891 A1 | 3/2006 | Pavier | |
| 2006/0292753 A1 | 12/2006 | Takahashi et al. | |

FOREIGN PATENT DOCUMENTS

| | | |
|---|---|---|
| CN | 1873938 | 12/2006 |
| DE | 10258844 A1 | 3/2004 |
| JP | 2004006596 | 1/2008 |

OTHER PUBLICATIONS

Office Action for DE 10 2007 014 389.5-33 dated Dec. 17, 2007.
English Translation of First Office Action in CN 200810095155.2 dated Jun. 5, 2009.
Mario Engl, et al., "mm-Wave Packaging: A Low-cost Solution based on a Leadless Plastic Package", 8 pages, date unknown but published prior to filing of present application.
German Office Action dated Nov. 30, 2010.

* cited by examiner

Primary Examiner — H. Jey Tsai
(74) Attorney, Agent, or Firm — Banner & Witcoff, Ltd.

(57) ABSTRACT

A method includes the steps of providing a carrier comprising a plurality of cavities; placing at least one semiconductor element into each of the cavities; filling the plurality of cavities with a packaging material; and removing the carrier.

9 Claims, 25 Drawing Sheets

A. Diebonding

B. Wirebonding

C. Molding/Curing

D. Laser Mark

E. Cu-Etching

F. Au Deposition

G. Lamination

H. Dicing

I. Visual Inspection

J. Elec.Test

K. Irradiation

L. Taping

A)

A)

B)

Diebonding

A)

B)

A)

B)

METHOD AND APPARATUS FOR FABRICATING A PLURALITY OF SEMICONDUCTOR DEVICES

TECHNICAL FIELD

The invention relates to fabricating a plurality of semiconductor devices.

BACKGROUND

Packaging, e.g. integrated circuit packaging, is the final stage of semiconductor device fabrication. The packaging may also provide an interconnection from a circuit, e.g. an IC (IC=Integrated Circuit) or semiconductor element, to a support, e.g. a substrate or a printed circuit board (PCB). Further, packaging provides for a desired mechanical protection and a protection from the environment to ensure reliability and performance of the device.

SUMMARY

According to different embodiments a method may comprise providing a carrier comprising a plurality of cavities; placing at least one semiconductor element into each of the cavities; filling the plurality of cavities with a packaging material; and removing the carrier.

BRIEF DESCRIPTION OF THE DRAWINGS

In the following, the embodiments are explained in more detail with reference to the accompanying drawings in which.

DETAILED DESCRIPTION

Figure 1A:
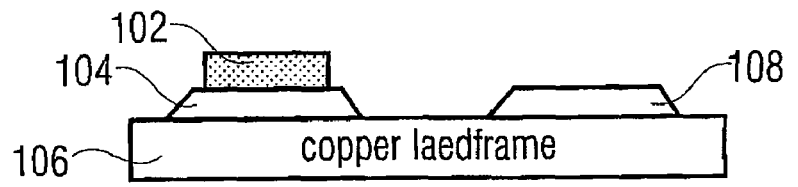
FIGS. 1A to 1C show a conventional semiconductor packaging process.
Figure 1A:
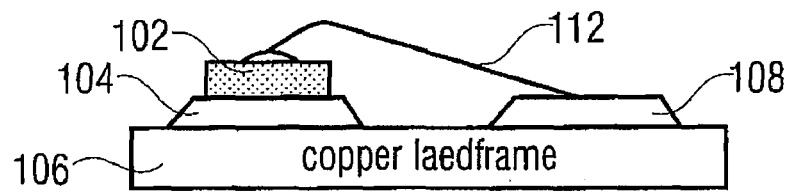
Figure 1A:
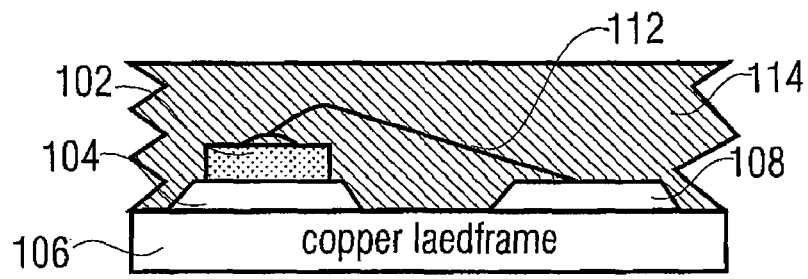
Figure 1A:
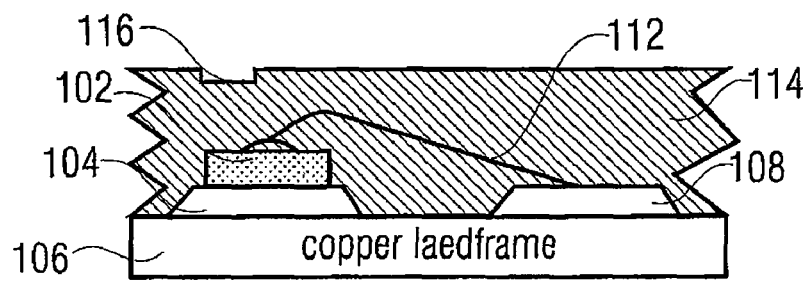
Figure 1A:
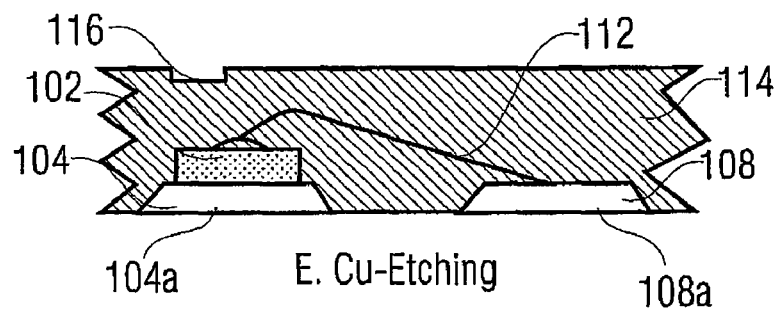

According to other embodiments, an apparatus for fabricating a plurality of semiconductor devices may comprise a first height comprises a plurality of cavities, each cavity being defined by a wall having a second height being equal to or greater than the first height.

According to other embodiments, an apparatus for fabricating a plurality of semiconductor devices may comprise a first height comprises a plurality of cavities, each cavity being defined by a wall having a first height, wherein at least a section of the wall has a second height lower than the first height.

In general, the assembly of a semiconductor device may comprise a step of die preparation, during which a wafer is cut to obtain individual integrated circuits or dice. The steps following the die preparation will be described below with reference to FIG. 1 showing a conventional process for fabricating semiconductor device packages.

This process comprises a step A of die attachment or bonding in which a die 102 is attached to a die pad 104 provided on a support or carrier structure 106, e.g. a copper leadframe, of the semiconductor device. On the copper leadframe 106 also a contact pad 108 is provided. The contact pad 108 provides for a connection to electrical extremities of the package. The next step is the wire bonding step B in which a bond connection 112 is made between the die 104 and the contact pad 108, thereby allowing the die 104 to be connected to the outside world. A step of encapsulation C follows, usually by plastic molding, which provides a "body" 114 of the package of the semiconductor device for physical and chemical protection. Step C is referred to as molding and may also include curing of the molded package. In FIG. 1, for the sake of clarity, only one die 102 is shown in the respective steps. In an actual packaging process, however, a plurality of dice will be placed on the leadframe 106. In general this is referred to as block molding in accordance with which several dice, e.g. chips or semiconductor elements, on a leadframe strip or leadframe array are encapsulated within a single molded body. To be more specific, for fabricating a plurality of semiconductor devices conventional approaches require feeding a leadframe strip into a die bonder machine. The die bonder machine picks up a die from a wafer and die-attaches (see step A) it to the headrace strip. In subsequent steps a die is subjected to wire bonding (see step B) and to molding and curing (see step C). The subsequent steps that give the package its final form and appearance, for example DTFS (DTFS=Deflash/Trim/Form/Singulation), vary from package to package. Steps like marking and lead finishing give the product its own identity and improve reliability.

In the example in FIG. 1, a laser marking step D follows step C to put an identification mark, traceability mark or a distinguishing mark 116 on an outside surface of the mold 114. Besides laser marking also ink marking is used. Further, the leadframe 106 on which the plurality of semiconductor devices is fabricated, is subjected to etching for removing the leadframe 106 as is shown in step E. As can be seen, by removing the leadframe 106 the lower surfaces 104a and 104b (as shown in FIG. 1) of the die pad 104 and the contact pad 108 are exposed. Then, gold layers 124a and 124b may be deposited in step F on the exposed surface 104a of the die pad 104 and on the exposed surface 108a of the contact pad 108. In a next step G the mold 114 is taken upside down and laminated to a laminate layer or tape 126 in preparation of subsequent dicing or singularizing. The packages are then singulated in step H, e.g. by sawing the mold 114. In FIG. 1 step H shows the situation after sawing, namely the saw grooves 128a and 128b extending thought the mold 114 but not through the laminate tape 126. Once assembled as shown in step H of FIG. 1, the packed circuit is basically ready to use.

However, owing to imperfections, assembled devices do not always work. A plurality of things may go wrong during the production process, for example, wafer fabrication related defects, or a die cracking during assembly, or wire-bonds poorly connected or not connected at all. Thus, in a further step the semiconductor device package is typically subjected to visual inspection, followed by electrical testing. To be more specific, following the singularizing in step H, a visual inspection is made, e.g. by a camera 130, in step I. Further, an electrical test is conducted in step J by applying a stimulus signal to the die pad 104 via a first probe 132a and receiving the response signal via the contact pad 108 and a second probe 132b. By means of external test circuits the response may be evaluated to determine whether the tested element passed or failed the test.

In step K the inspected and tested device is subjected to UV radiation provided by a UV lamp 134. The UV lamp 134 irradiates the laminated tape 126 for removal of same form the mold 114, such that the individual singularized semiconductor packages may be packed by loading them in step L into individual pockets 136 of a pocket tape or carrier tape 138. Packing the semiconductor units by taping facilitates automated retrieval and mounting of the semiconductor components on a PCB during manufacturing.

The molding process described in step C of FIG. 1 typically molds a whole piece of leadframe. Consequently, the process flow requires the dicing process at step H, e.g. sawing, to dice out individual semiconductor device packages. A lamination process at step G is required for laminating the leadframe strip in order hold the individual semiconductor packages after dicing in step H. UV-irradiation is then required in step K prior to taping in step L.

Hence, it may be desirable with regard to process speed, process costs and process yield to reduce the number of steps in the packaging process.

The embodiments concern an approach for packaging a semiconductor device without the necessity of sawing a molded block of packaging material holding a plurality of dice for obtaining a plurality of packaged semiconductor devices.

Referring now to FIG. 2 a method for fabricating a plurality of semiconductor devices according to an embodiment shall be described. As is shown in FIG. 2A, a carrier 200 having a plurality of cavities 202a to 202c is provided. Although only three cavities are shown, it is to be noted that in general two or more than three cavities may be provided. The cavities may be provided in a two-dimensional array of cavities. The carrier 200 comprises a bottom part 200a from which a plurality of wall portions 200b extend upwardly to define the cavities 202a to 202c. The wall portions 200b may for example be grown from the bottom part 200a by a conventional growing process. The bottom part 200a of the carrier 200 may be a copper lead frame. Also, the carrier 200 may be formed of aluminum, plastic, rubber, paper card. The carrier may be flexible or rigid.

Figure 2A:
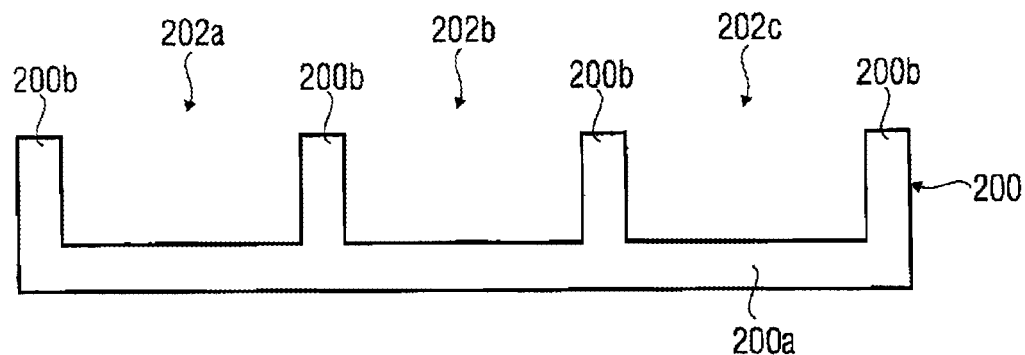
FIGS. 2A to 2G show a method for fabricating a plurality of semiconductor devices according to an embodiment.
Figure 2B:
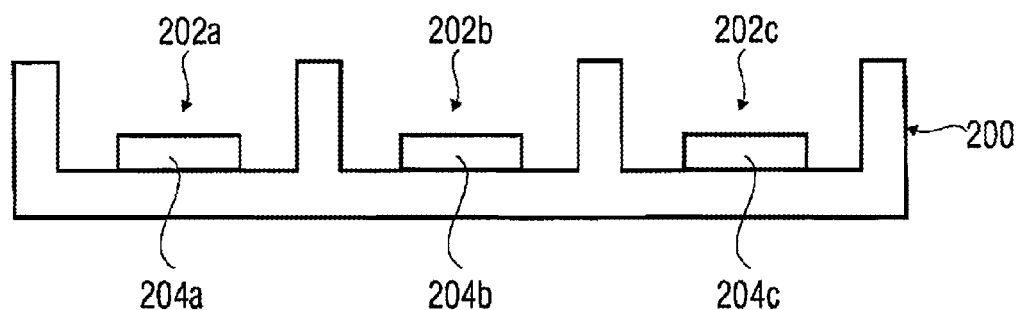

Into the cavities 202a through 202c respective semiconductor elements 204a to 204c are placed, as is shown in FIG. 2B. The semiconductor elements 204a to 204c may be attached to the bottom part 200a of the carrier 200 by gluing or taping. In addition, electrical connections of the semiconductor elements 204a to 204c to conductive parts may be made. Also, it is noted that in FIG. 2 the provision of a single semiconductor element 204a to 204c into the respective cavities is shown, however, also more than one semiconductor element 204a to 204c may be provided in one or more or all of the cavities, depending on the device to be formed.

Figure 2C:
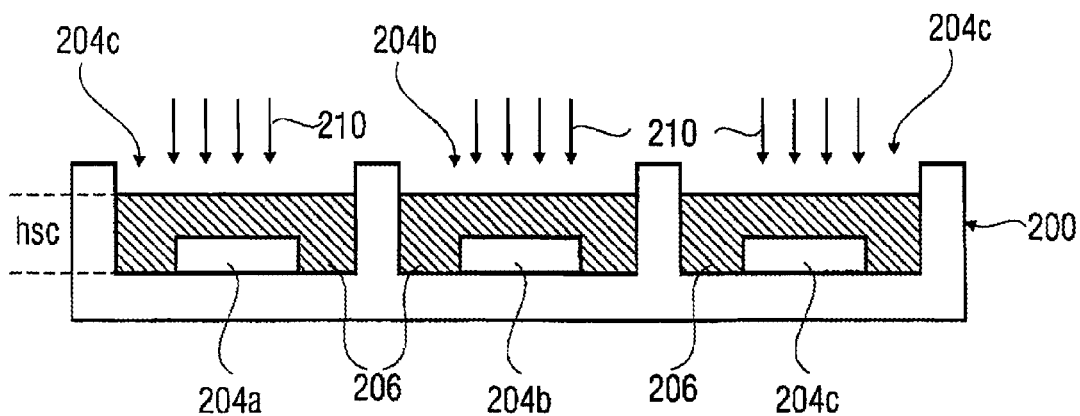

The plurality of adjacent cavities 202a to 202c holding the semiconductor elements 204a to 204c is filled with a packaging material 206 as is shown in FIG. 2C and indicated by arrows 210 to obtain a plurality semiconductor devices. As can be seen, the packaging material is provided with a first height $h_{SC}$. The packaging material 206 may be a conventional mold material, e.g. a polymer like a resin. Often the mold material is filled with $SiO_2$ to adjust the coefficient of thermal expansion (CTE) of the mold material to the CTE of the semiconductor device.

Figure 2D:
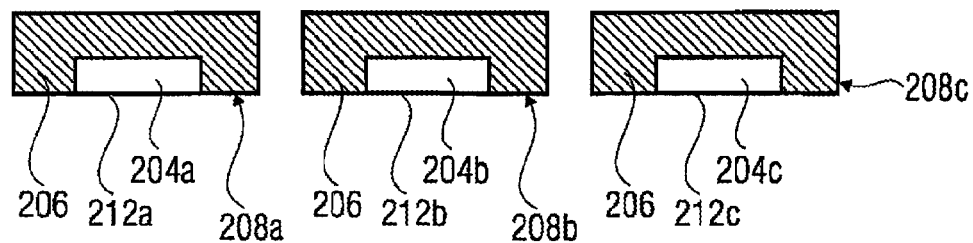

After filling the cavities with the packaging material 206, and after solidification, the carrier 200 is removed to yield the respective separated semiconductor devices 208a through 208c as is shown in FIG. 2D. The carrier 200 described above may be made from an etchable material and in this case removing the carrier 200 may comprise an etching process. Alternatively, the carrier may be stripped from the filled cavities. The technique for removing the carrier 200 depends on the material from which the carrier 200 is formed. Solidification of the mold material is done depending on the material chosen, e.g. resin is usually solidified by thermal process.

The carrier 200 may be a rigid or a flexible member made from copper, e.g. a copper pillar, aluminum, plastic, rubber, paper, card, etc.

Figure 2E:
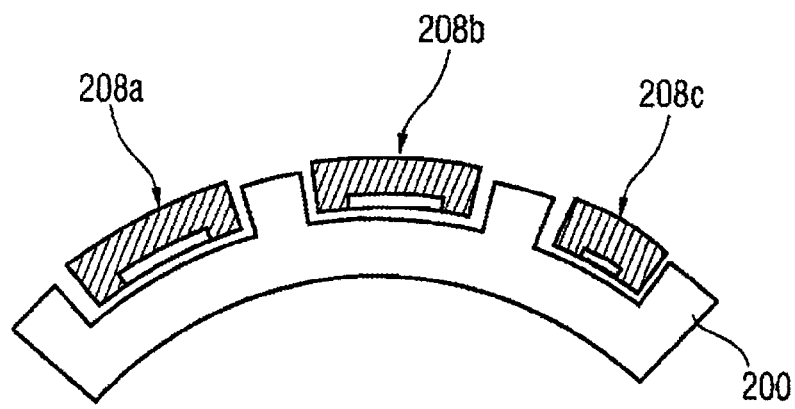

A rubber-like carrier 200 may be removed by bending the carrier 200 as is shown in FIG. 2E. By bending the flexible carrier 200 in a manner as shown in FIG. 2E the respective semiconductor devices 208a through 208c are freed from the carrier 200. The carrier may again be used in a further packaging process.

As can be seen, the process does not require a sawing step. By the mere removing of the carrier 200 packaged semiconductor devices may be separated. Further, omitting sawing may avoid mechanical stress on the packaged semiconductor devices thereby avoiding damages of the packaging.

As is shown in FIG. 2 the semiconductor elements 204a to 204c may be placed in the carrier 200 such that after filling the packaging material 206 and removing the carrier 200 one surface 212a, 212b, 212c (see FIG. 2D) of the semiconductor elements 204a to 204c is exposed. This surface may carry respective connection pads for allowing electrical connection of the semiconductor elements 204a to 204c. This way, the semiconductor elements may be electrically connected to the outside, e.g. by means of bond wires or solder bumps connecting the contact pads on the exposed surface to a substrate or printed circuit board.

Figure 2F:
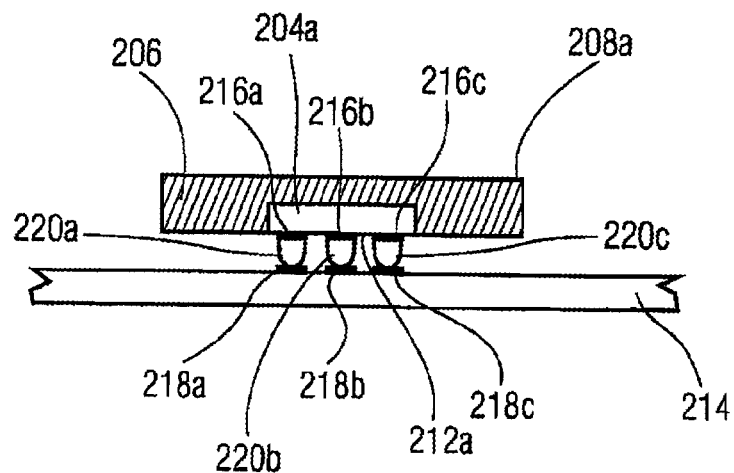

FIG. 2F shows an example for mounting a semiconductor device 208a to a substrate 214. On the exposed surface 212a a plurality of contact pads 216a through 216c are formed. Corresponding pads 218a to 218c are formed on the substrate 214. This arrangement allows flip-chip bonding of the semiconductor device 208a to a substrate 214 by providing solder balls 220a to 220c between the semiconductor device's contact pads 216a to 216c and the substrate's contact pads 218a to 218c.

Figure 2G:
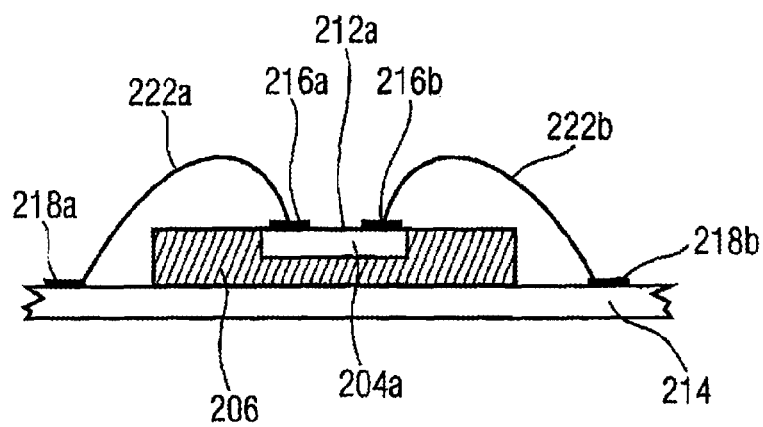

FIG. 2G shows a further example for mounting a semiconductor device 208a to a substrate 214. On the exposed surface 212a a plurality of contact pads 216a and 216b are formed. Contact pads 218a and 218b are formed on the substrate 214. The semiconductor device 208a is arranged on the substrate 214 and may be fixed by gluing or the like. Between the semiconductor device's contact pads 216a and 216b and the substrate's contact pads 218a and 218b respective bond wires 222a and 222b are provided.

With reference to FIG. 3 a method for fabricating a plurality of semiconductor devices according to another embodiment shall be described. This embodiment is to package a semiconductor chip in a TSLP package (Thin Small Leadless Package).

Figure 3A:
FIGS. 3A to 3M show a method for fabricating a plurality of semiconductor devices according to a further embodiment forming a TSLP.
Figure 3B:
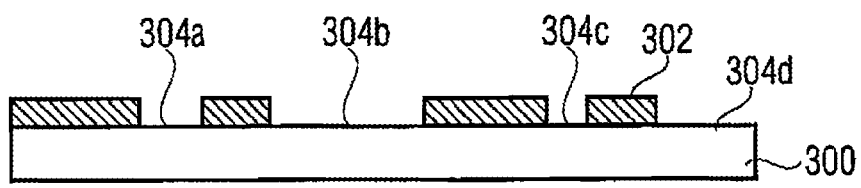
Figure 3C:
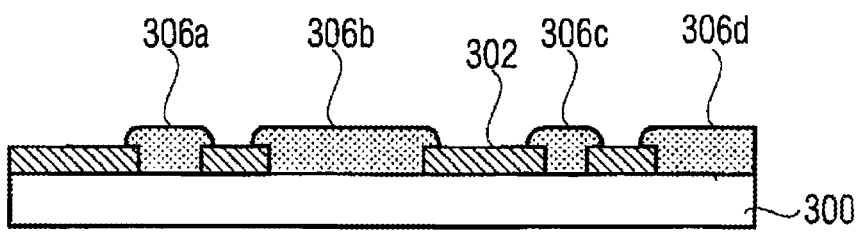
Figure 3D:
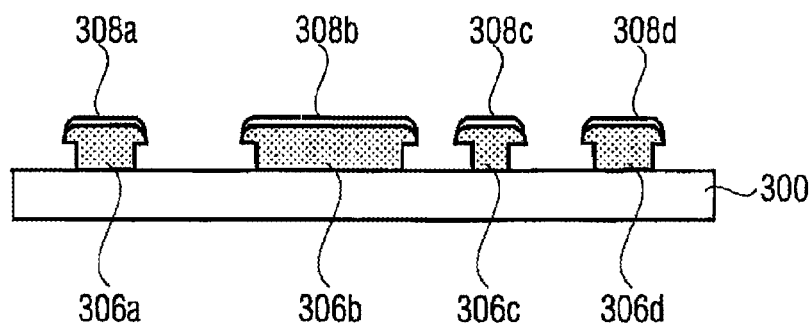

In FIG. 3A a copper plate 300 is provided. The plate may also be made from another material, like Sn, Zn, Ni. The copper plate 300 is then masked for a selective galvanization by providing onto the copper plate 300 a resist layer 302 as is shown in FIG. 3B. The resist layer 302 is patterned to define surface regions 304a to 304d on the copper plate 300 which will be subjected to a subsequent galvanization process for growing metal bumps on the surface regions 304a to 304d. Then, nickel bumps 306a to 306d, which may form die pads and contact pads, are galvanically grown, as indicated in FIG. 3c. The nickel bumps 306a to 306d may be grown to a height of about 50 μm to about 200 μm. After the nickel bumps 306a to 306d are completed the resist layer is removed, e.g. by a selective etching process, and a gold layer 308a to 308d is provided on the upper surfaces of the nickel bumps 306a to 306d as is shown in FIG. 3D. It should be noted that the bumps may be as well of metals other than nickel as long as the material of the bumps is different to the material of plate 300. This is to etch base 300 selectively to the bumps 306a to 306d in a later process step.

Figure 3E:
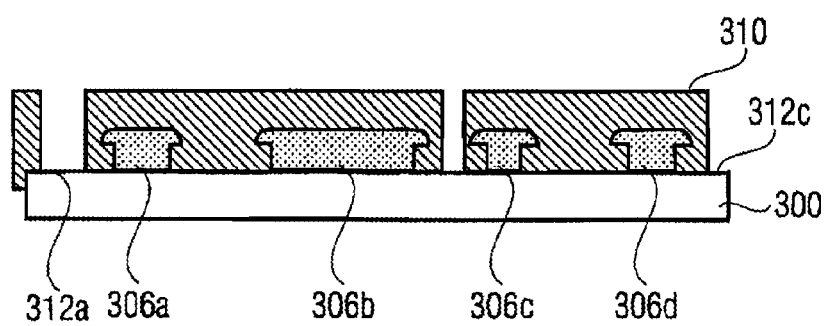
Figure 3F:
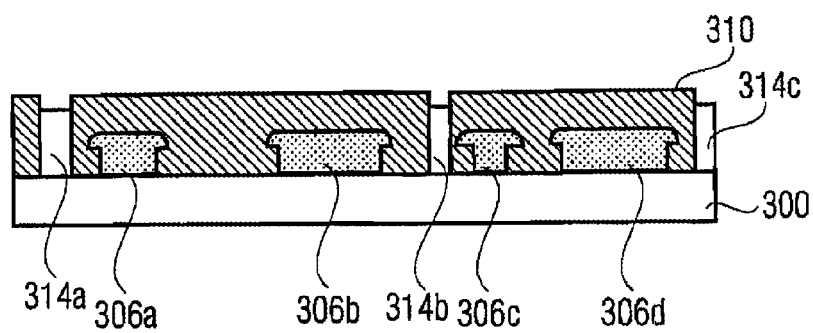
Figure 3G:
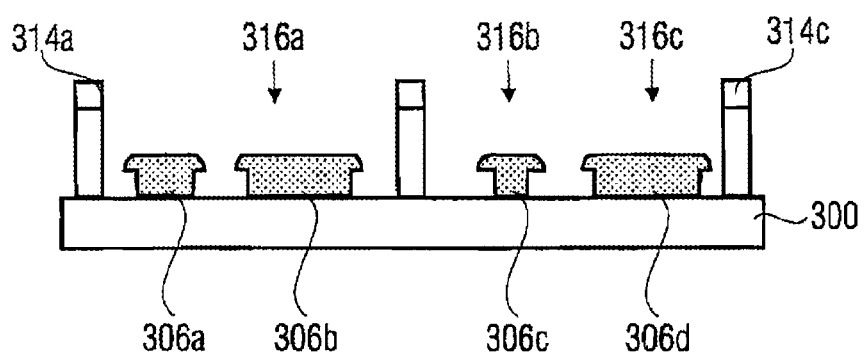

The structure shown in FIG. 3D is then subjected to a further masking step for defining boundaries for the cavities. As can be seen from FIG. 3E a further resist layer 310 is provided and patterned to define surface regions 312a to 312c on the copper plate 300 which will be subjected to a subsequent galvanization process for growing walls defining the boundaries. The structure shown in FIG. 3E is subjected to a galvanization process for growing the copper boundaries on the copper plate 300 at the exposed surface regions 312a to 312c thereof. The structure after the galvanization process is shown in FIG. 3F with the copper walls 314a to 314c formed. The copper walls 314a to 314c may be formed with a height of about 100 μm to about 200 μm. FIG. 3G shows the structure of FIG. 3F with the resist layer 310 removed which defines a carrier having cavities 316a and 316b for receiving semiconductor elements for packaging as will be described below in further detail.

Figure 3H:
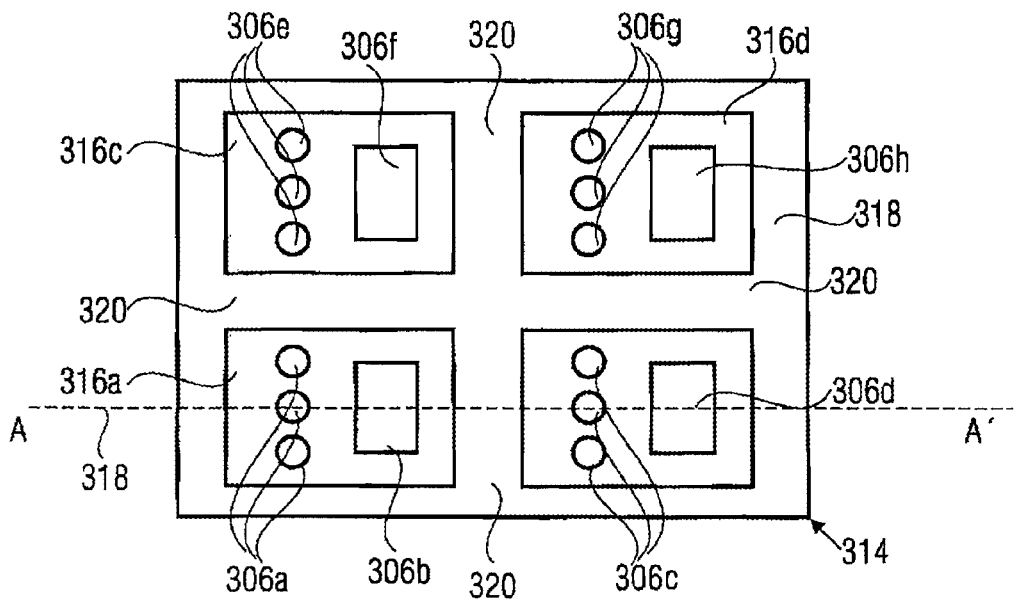

FIG. 3A to 3G showed cross-sectional views of the structures at respective process steps. FIG. 3H shows a top view of the structure shown in FIG. 3G. Line A-A' in FIG. 3H indicates the cross section line chosen for the cross sectional views of FIGS. 3A to 3G. As can be seen, a plurality of cavities 316a to 316d is formed each comprising the die pads 306b, 306d, 306f and 306h and the contact pads 306a, 306c, 306e and 306g. Each of the contact pads 306a, 306c, 306e and 306g may comprise a plurality (in FIG. 3H three) single pad portions. The cavities 316 are surrounded by the copper wall 314 having an outer wall portion 318 an a plurality of inner wall portions 320, the inner wall portions 320 defining wall portions common to two or more cavities. As is shown in FIG. 3H the cavities may be arranged in a rectangular grid and the walls may form rectangular boundaries. The carrier which may be formed as is shown in FIG. H forms the basis for the subsequent steps for forming packaged semiconductor devices.

Figure 3I:
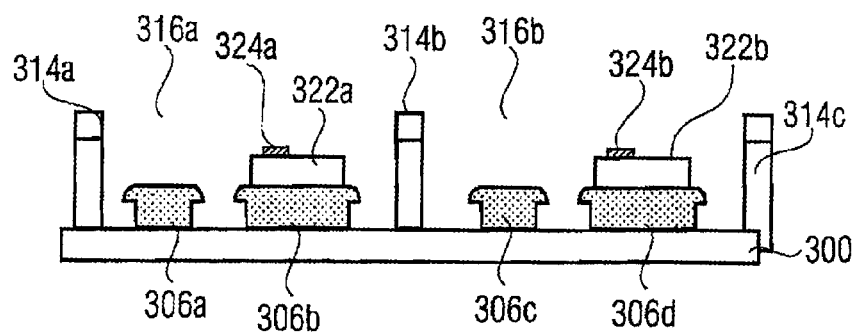
Figure 3J:
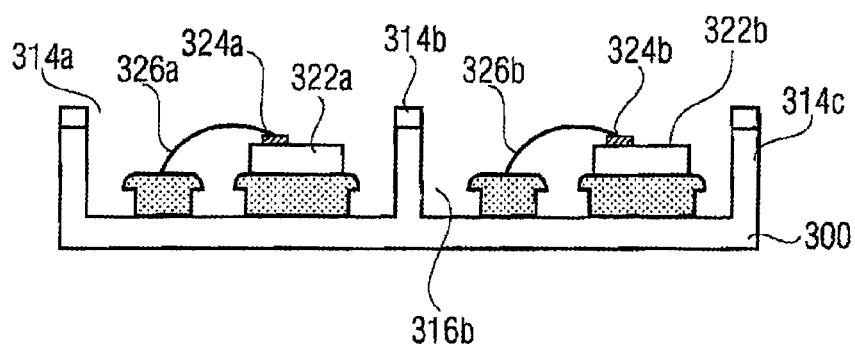

Into the cavities 316a and 316b chips 322a and 322b are placed, as can be seen in FIG. 3I. The chips 322a and 322b are arranged on the die pads 306b and 306d. The chips may be glued or soldered to the die pads 306b and 306d or may be fixed by other means. Each chip comprises one or more contact pads 324a and 324b, respectively. As can be seen, the chips 322a and 322b are arranged on the die pads 306b and 306d such that the surface holding the contact pad 324a and 324b faces away from the copper plate 300. Following the placement of the chips in the cavities, the chips' contact pads 324a and 324b are wire bonded to the respective pads 306a and 306c via a bond wire 326a and 326b, as is shown in FIG. 3J.

Figure 3K:
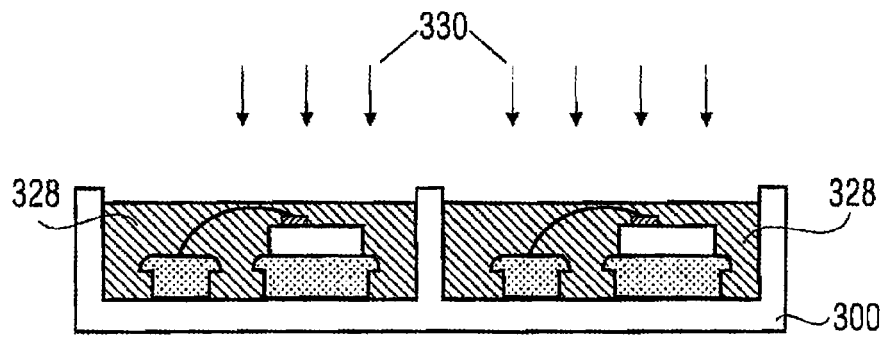
Figure 3L:
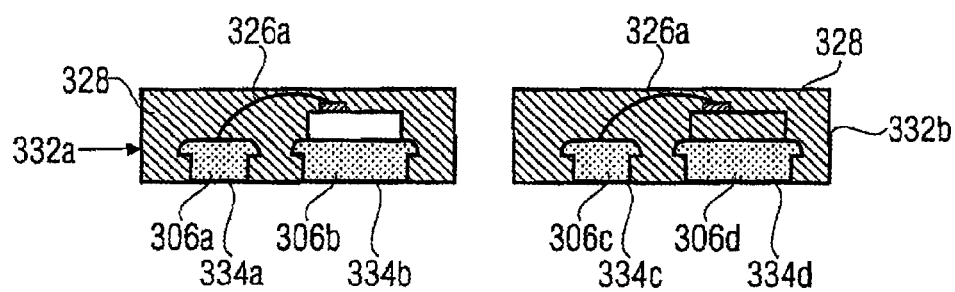

The cavities 316a and 316b are then filled with a packaging material 328 as is shown in FIG. 3K (see arrows 330). The packaging material may be a mold compound, e.g. a resin, which may comprise $SiO_2$ for CTE (Coefficient of Thermal Expansion) adjustment to Si which may be the main component of the chips 322a and 322b. After filling the cavities with the packaging material the copper carrier 300, 314 is removed by a copper etching process singulating the plurality of semiconductor devices into separate semiconductor devices 332a and 332b as is shown in FIG. 3L. The etching process may be selective with respect to copper so that the Ni bumps 306 remain with one surface 334a to 334d thereof now being exposed for electrical contacting.

Figure 3M:
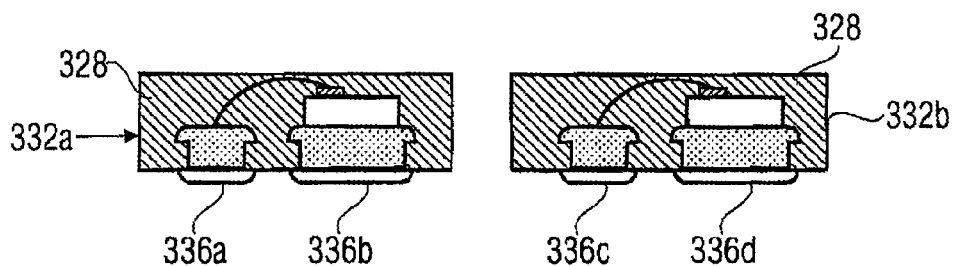

In an additional process shown in FIG. 3M the exposed surfaces 334a to 334d of the Ni bumps 306 may be provided with respective gold layers 336a to 336d for improving the contact properties.

Figure 4:
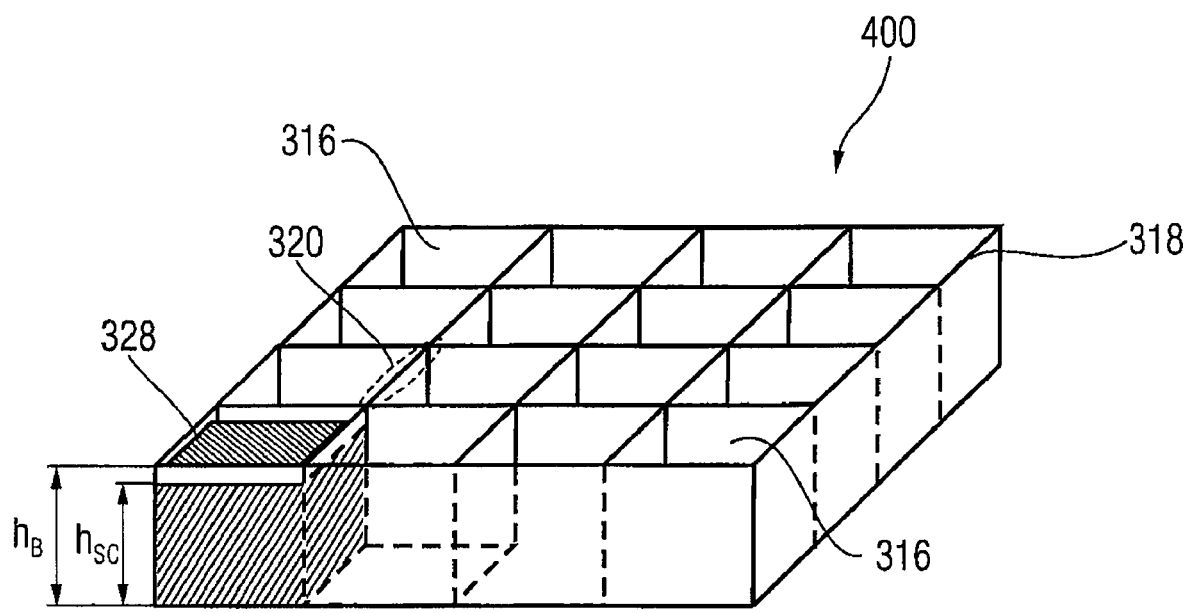
FIG. 4 shows an isometric view of an apparatus for fabricating a plurality of semiconductor devices according to an embodiment.

FIG. 4 shows an isometric and simplified representation of an apparatus 400 similar to the one shown in FIG. 3H. The apparatus 400 may be used for fabricating a plurality of semiconductor devices and may also be denoted as "grid separator tray" in the following. The apparatus 400 comprises 16 cavities 316 arranged in a 4×4 array in which semiconductor elements may be received in a manner as described above. Schematically one of the cavities is shown filled with the packaging material 328. The walls 318 (outer walls) and 320 (inner walls) surrounding the cavities 316 all have the same height $h_B$. The packaging material 328 may be filled into the cavities with a height $h_{SC}$, which may substantially determine the thickness of the semiconductor device produced. As can be seen, in the embodiment of FIG. 4 the height of the walls $h_B$ is greater then the height $h_{SC}$. The height of the walls $h_B$ may also be equal to the height $h_{SC}$.

The number, arrangement and geometric form of the cavities 316 depicted in FIG. 4 is a mere example. Other numbers, arrangement and forms may be selected. The arrangement shown in FIG. 4 may have been grown on a leadframe, e.g. by an electro-chemical process, particularly a galvanic growth process. Further, a copper etching process or a copper pillar growing process may be used. Further, the carrier and/or the leadframe may be made of copper or any other material that may be grown galvanically.

By removing the walls 318, 320 of the grid separator tray 400, as described above, the semiconductor devices are inherently singularized. Hence, no additional step for singularizing, e.g. by sawing, is necessary.

FIG. 5A shows an isometric view of an apparatus 450 similar to FIG. 4 according to a further embodiment. The basic structure of the apparatus 450 is the same as the apparatus in FIG. 4 except for the design of the intersections 460 of inner walls 320. As can be seen, in an area around an intersection of four inner walls 320 the height of the inner walls 320 decreases from the height $h_B$ to a height $h_{CB}$ which is less than the height $h_{SC}$ (see FIG. 4) of the semiconductor devices so that at least a part of a common wall 320 is lowered as indicated at reference numeral 460.

For the fabrication of the plurality of semiconductor packages, the cavities 316 of the grid separator tray 450 are filled with a packaging material (for reasons of clarity, only four of the cavities are shown filled) such that a plurality of adjacent filled cavities 316 is connected by the packaging material. Like in FIG. 4 the packaging material 328 is filled to the height $h_{SC}$, however, since the intersections 460 have a height lower than $h_{SC}$ the packaging material will connect adjacent cavities as an be seen at the intersection of the four cavities illustrated in FIG. 5A as being filled.

Figure 5:
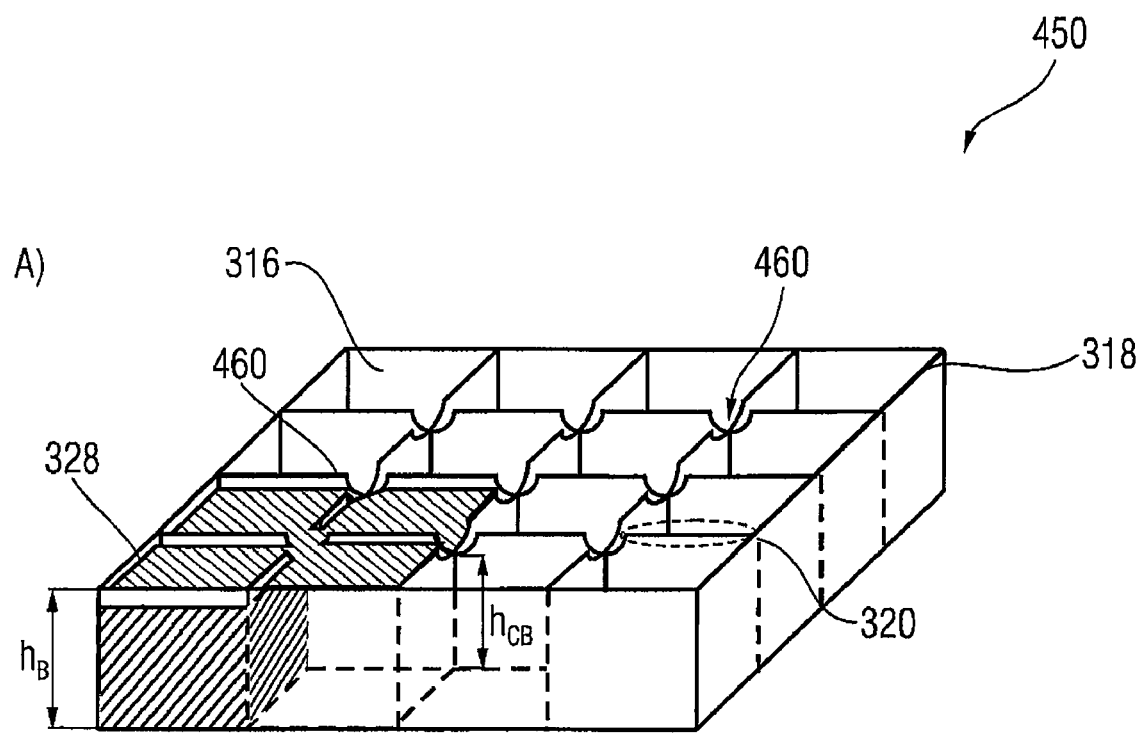
FIGS. 5A to 5C show a further embodiment.
Figure 5B:
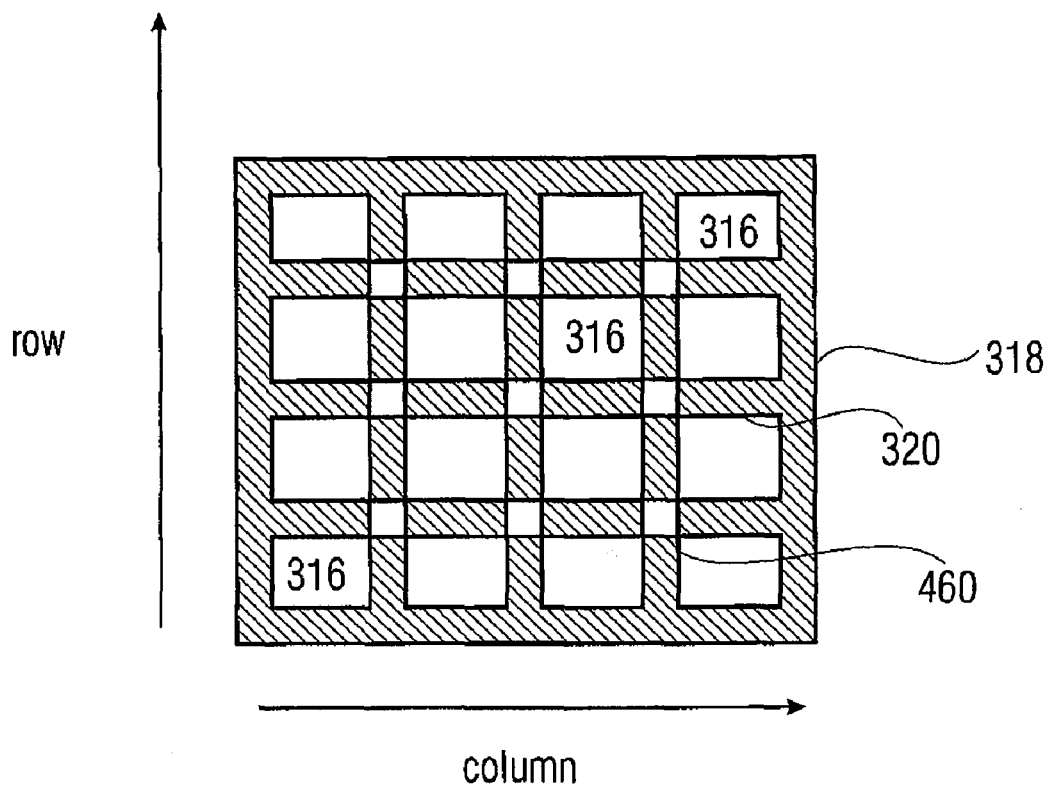

FIG. 5B is a top view of the apparatus 450 shown in FIG. 5A without any filled cavities 316. FIG. 5B shows an array of cavities 316, the array comprising a plurality of cavities arranged in a column direction and a plurality of cavities arranged in a row direction. Each of the cavities comprises a wall 318, 320 having the height $h_B$, except at the intersection portions 460 of the walls of four adjacent cavities where the height is lowered to $h_{CB}$ as explained above.

Figure 5C:
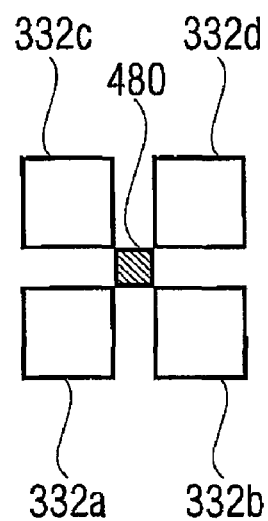

After removing the walls, i.e. the separator 450, the semiconductor devices are held together by thin mold or package material bridges 480 and hence are not fully singularized after removing the walls. FIG. 5C shows exemplary how four semiconductor devices 332a to 332d are held together by the thin bridge 480 of packaging material.

Figure 6:
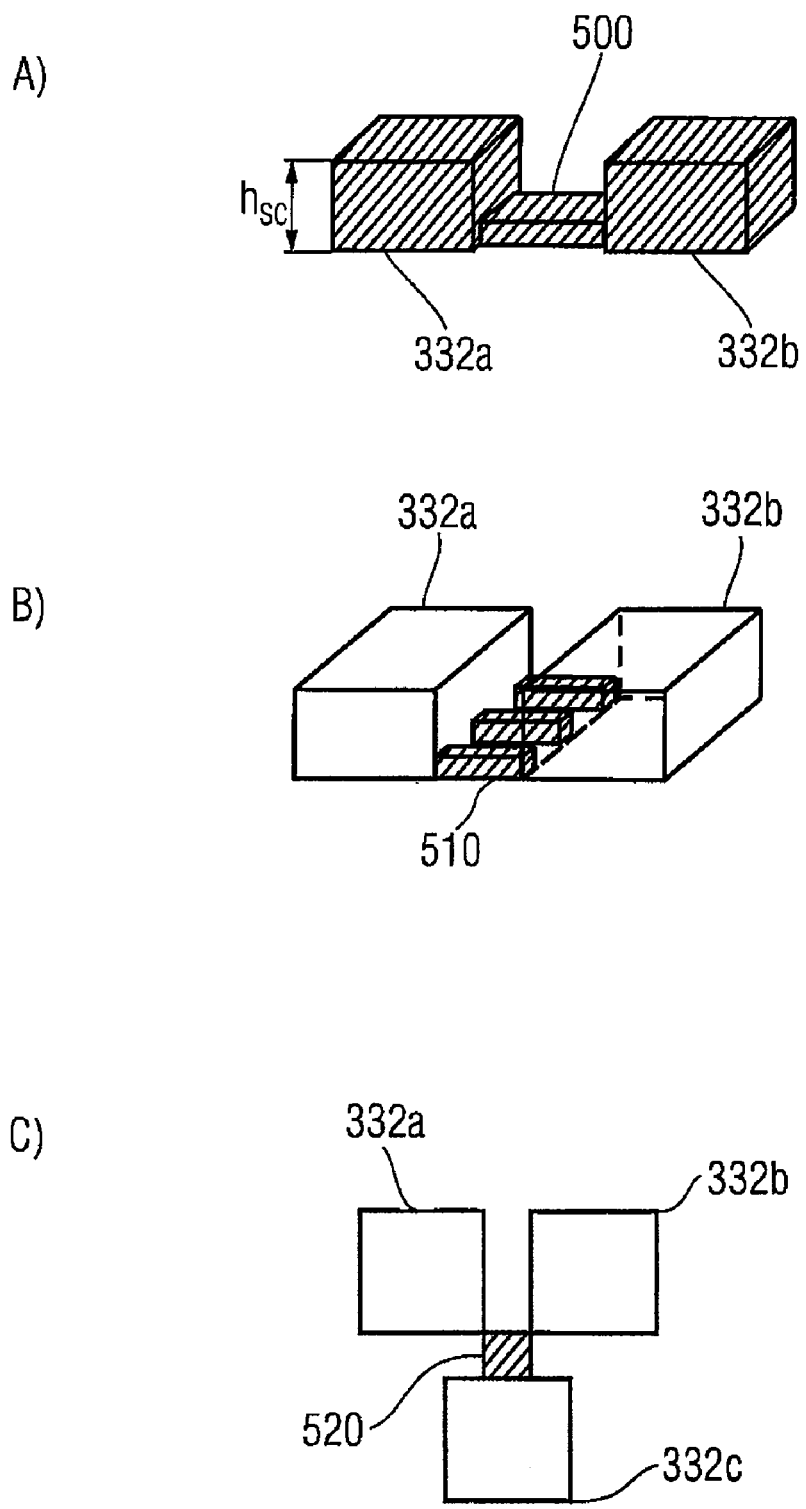
FIGS. 6A to 6C show schematic views of semiconductor devices connected by different package material bridges.
Figure 7:
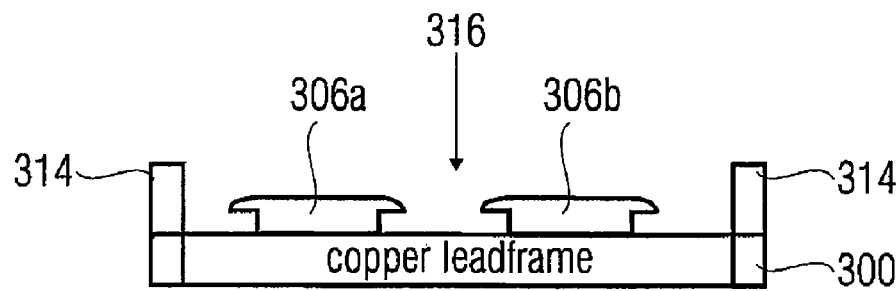
FIGS. 7A-7B, 8A-8B, 9A-9B, 10A-10C, 11A-11B, 12A-12C, 13A-13C, 14A-14B, 15A-15C, 16A-16C, 17A-17D describe a further embodiment using a copper separator tray.
Figure 7:
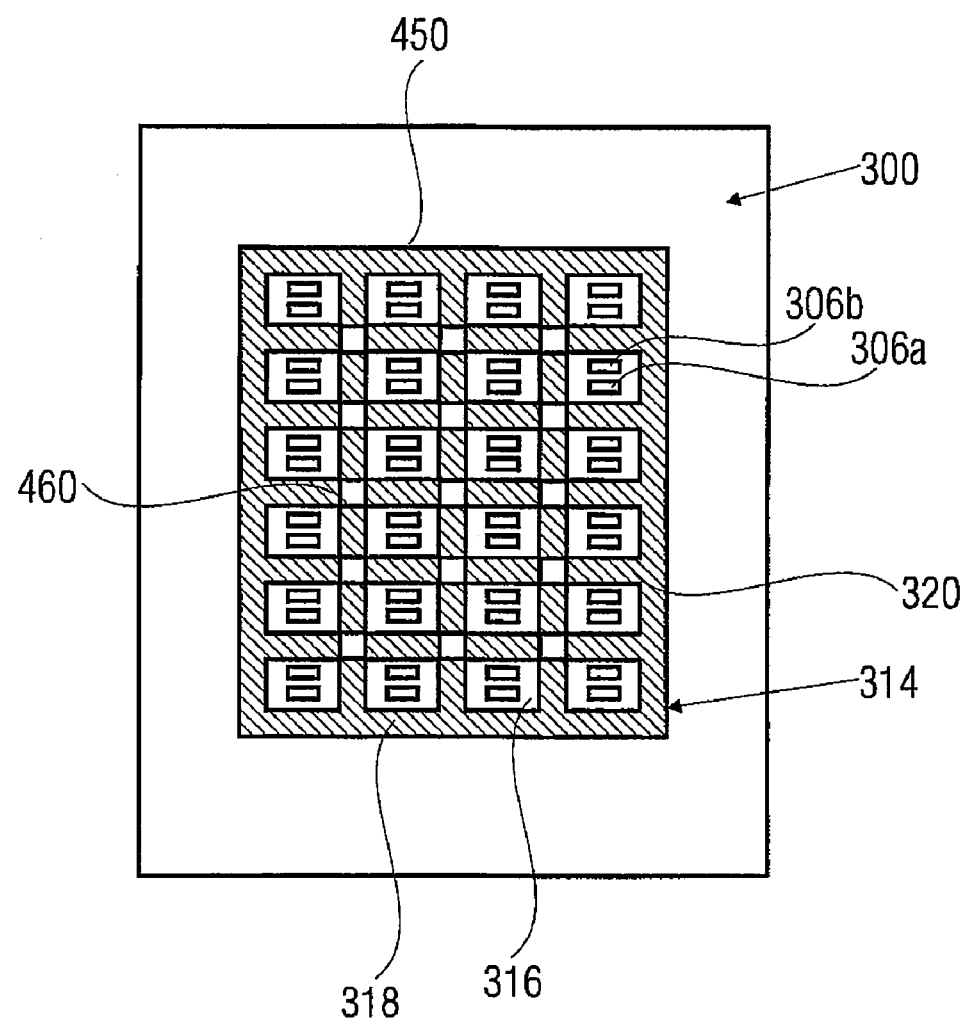
Figure 8:
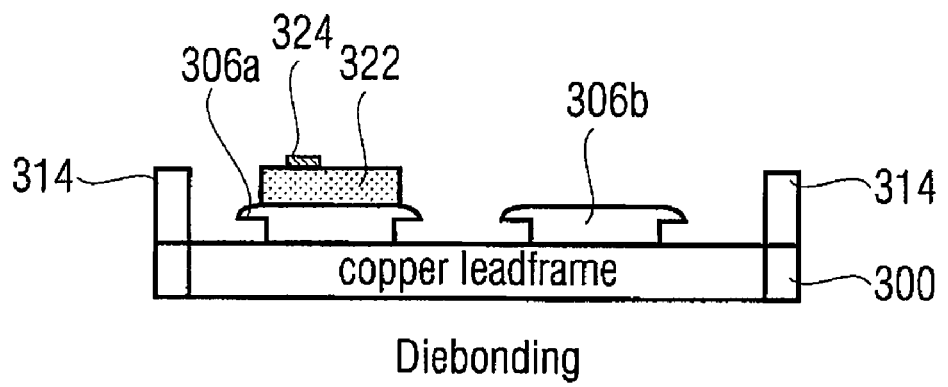
Figure 8:
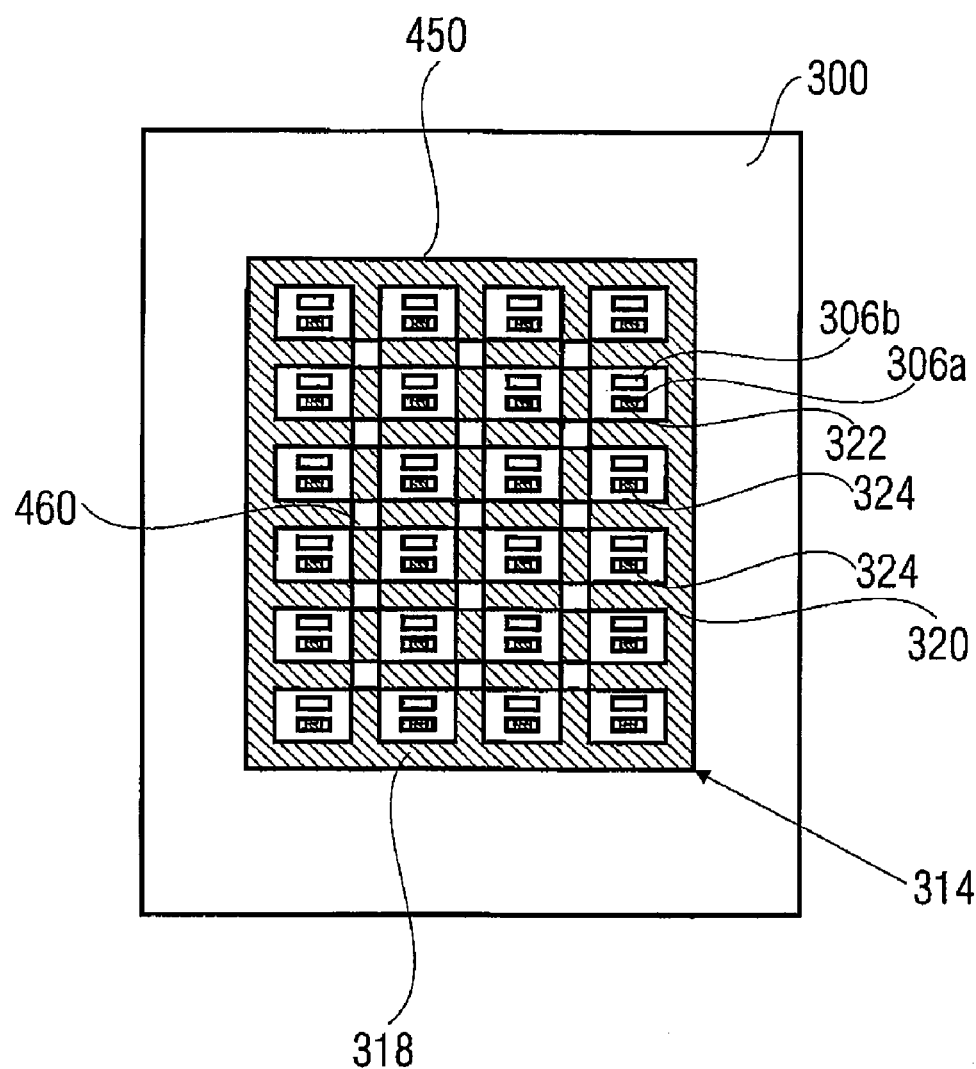
Figure 9:
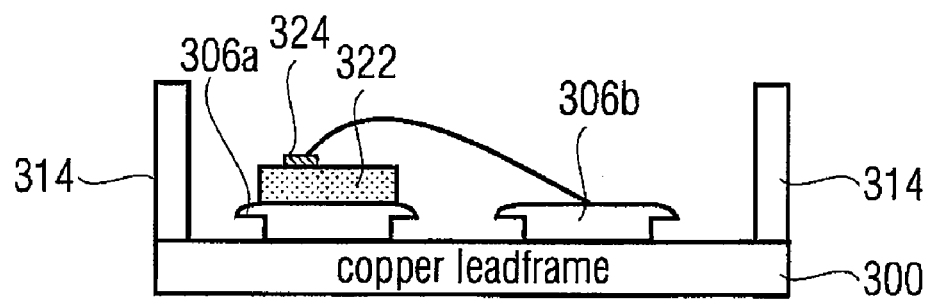
Figure 9:
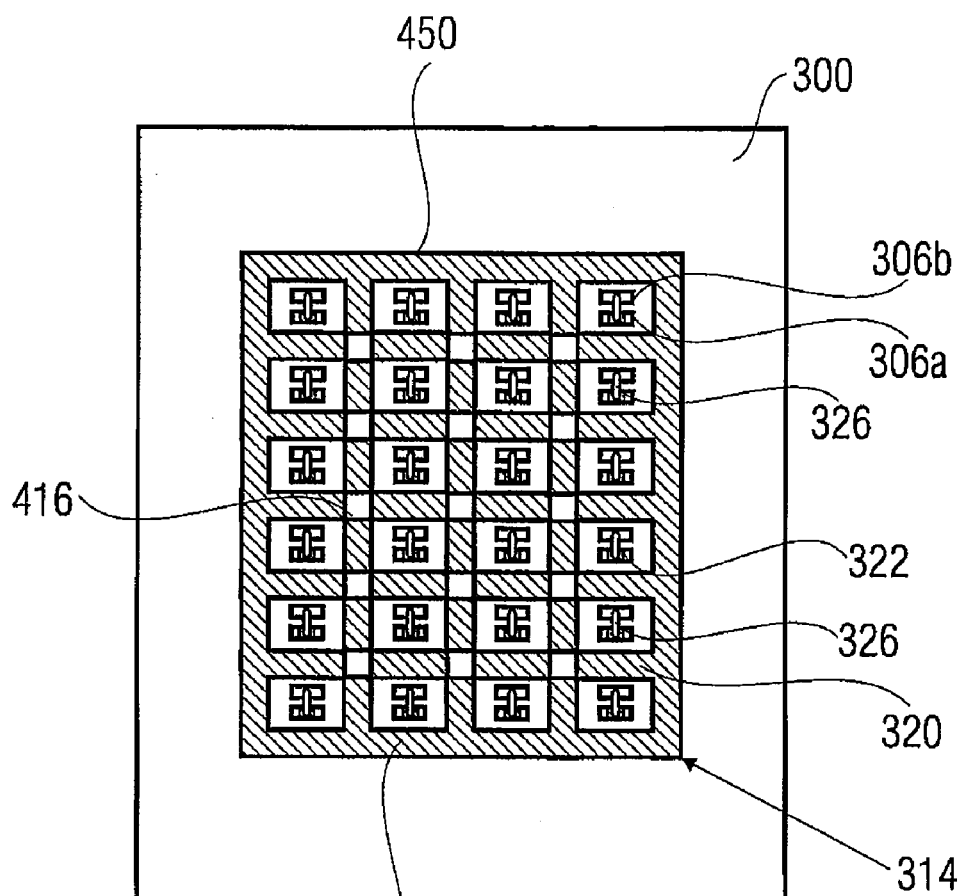
Figure 10:
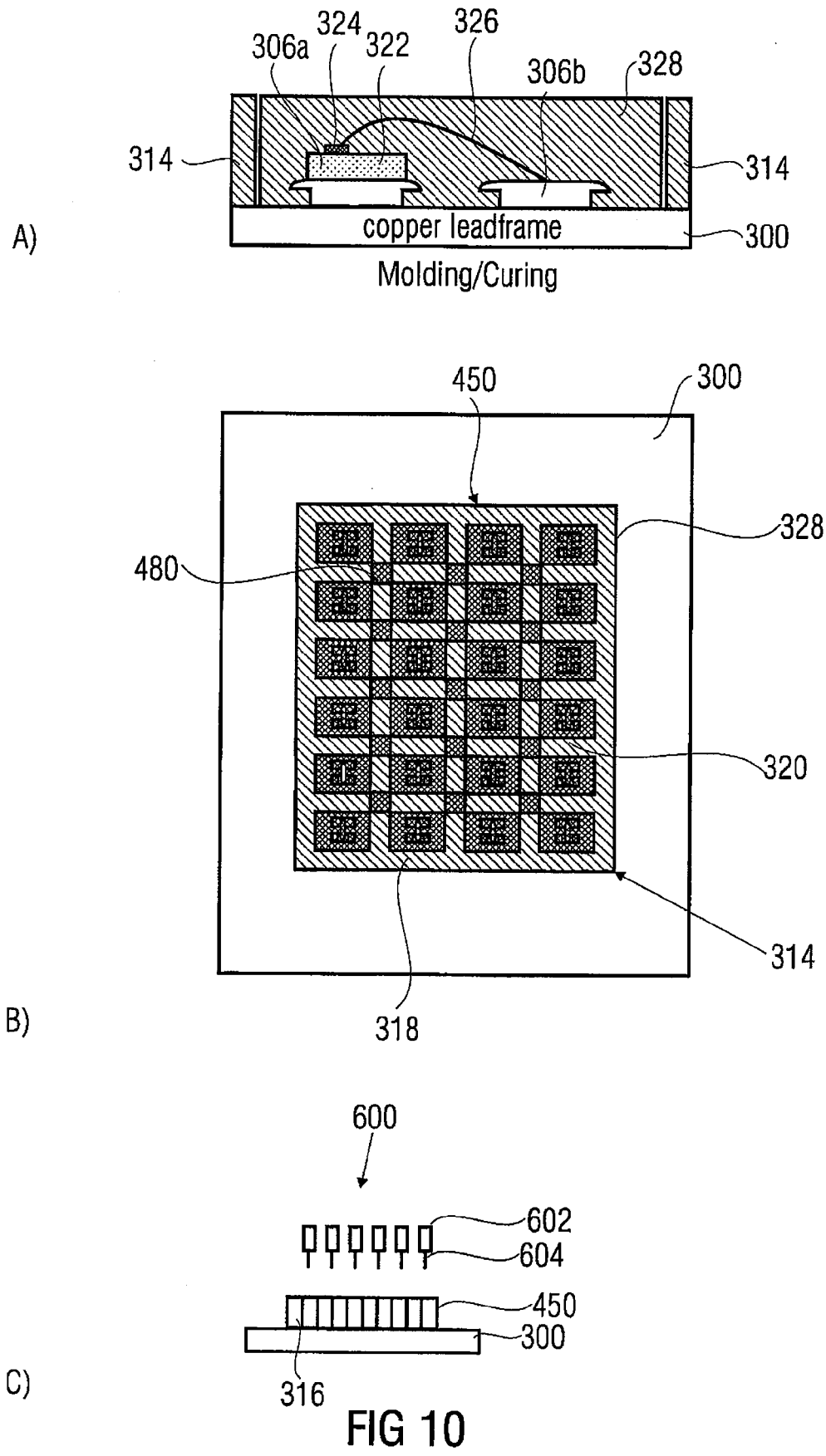
Figure 11:
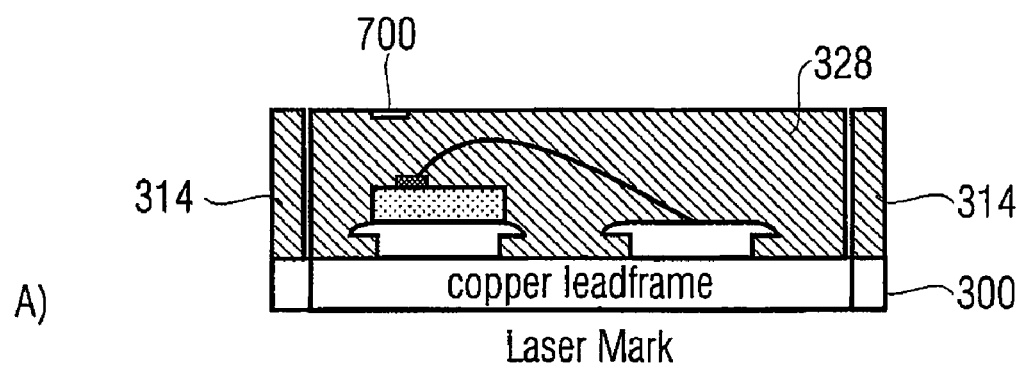
Figure 11:
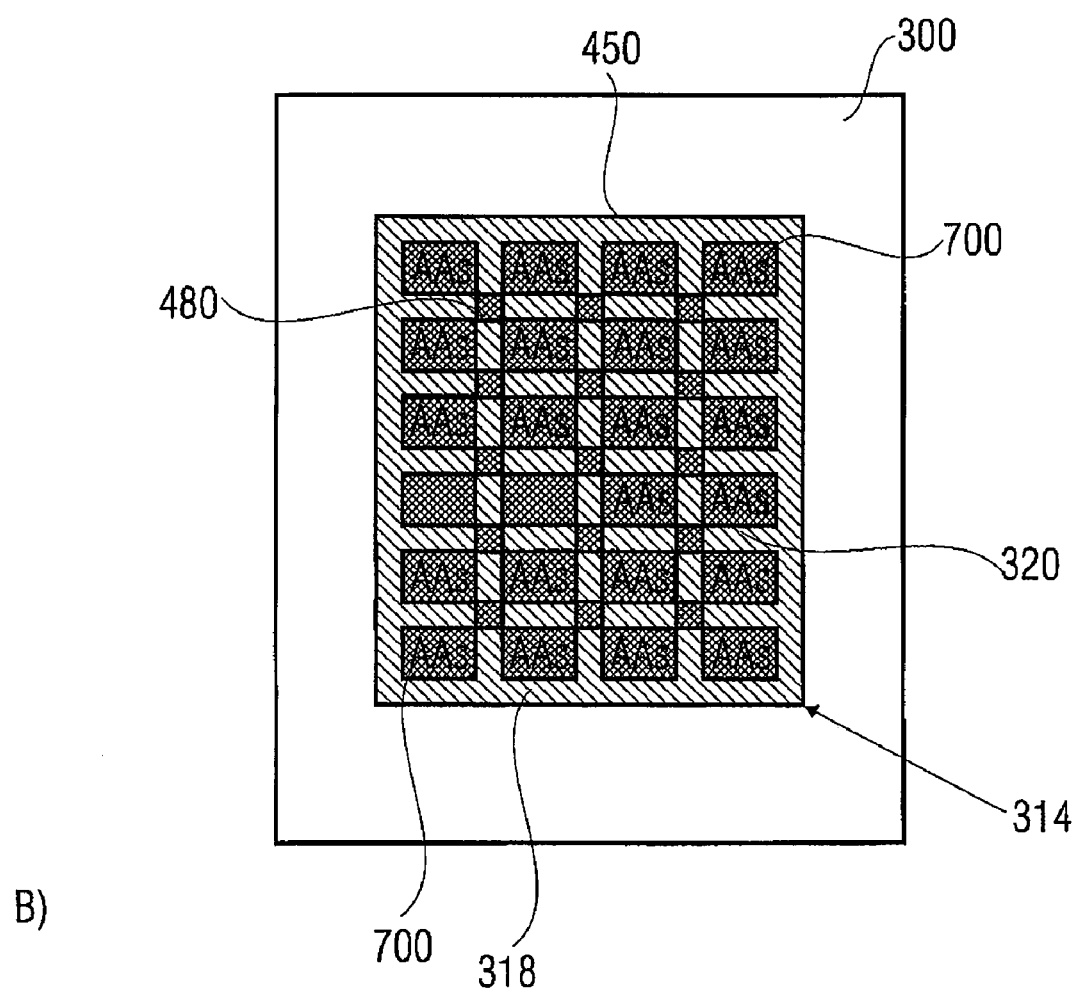
Figure 12:
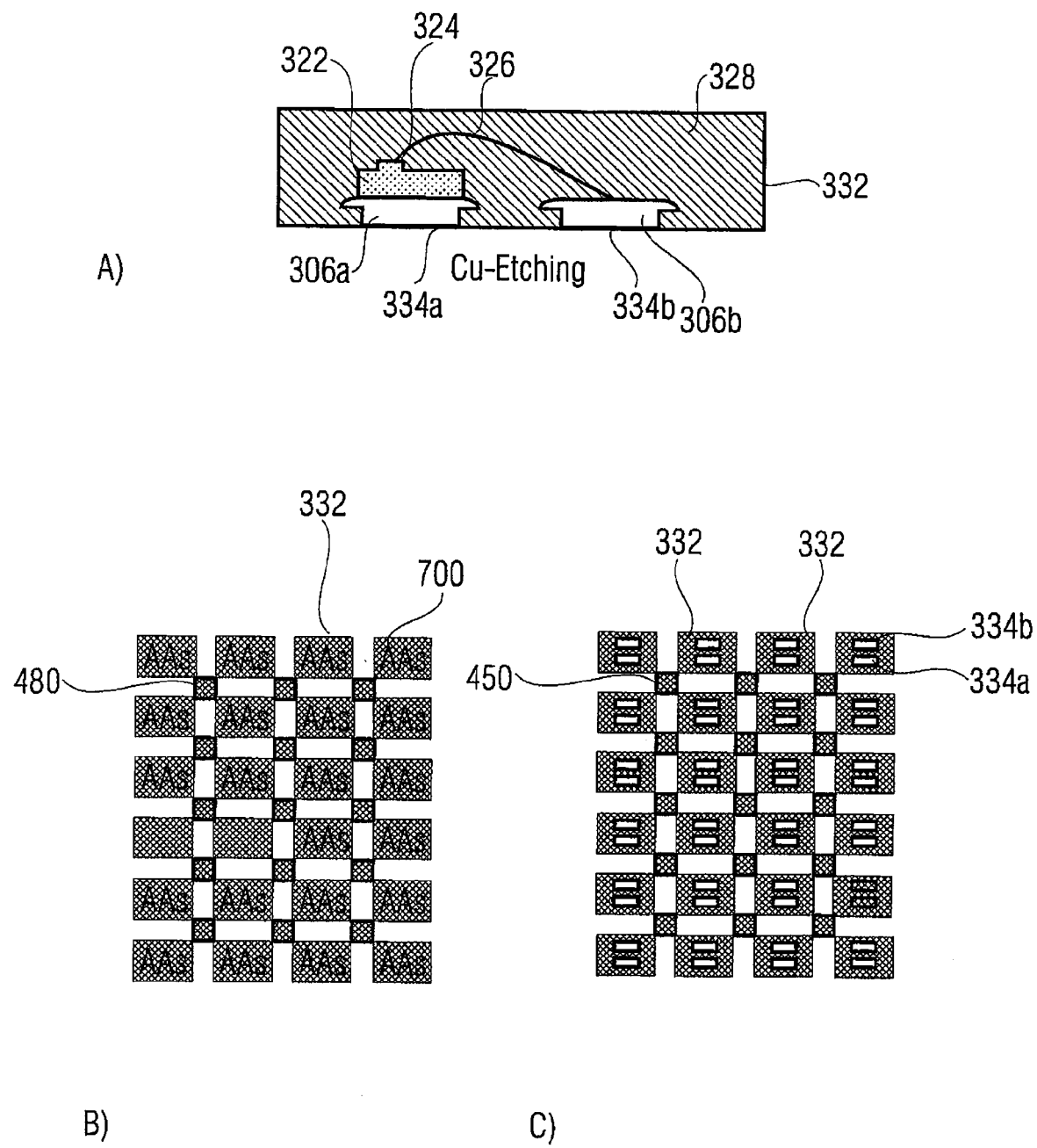
Figure 13:
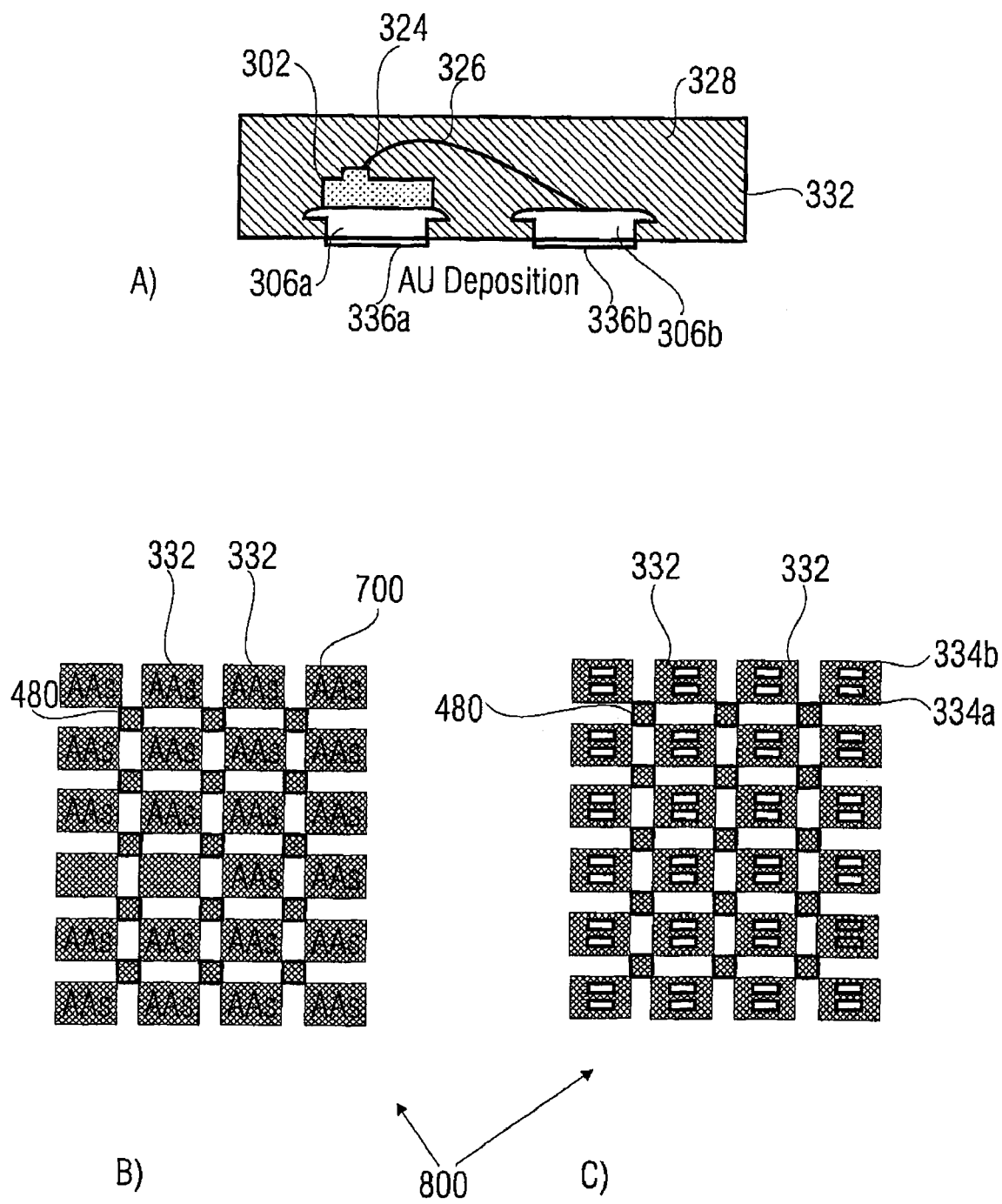
Figure 14:
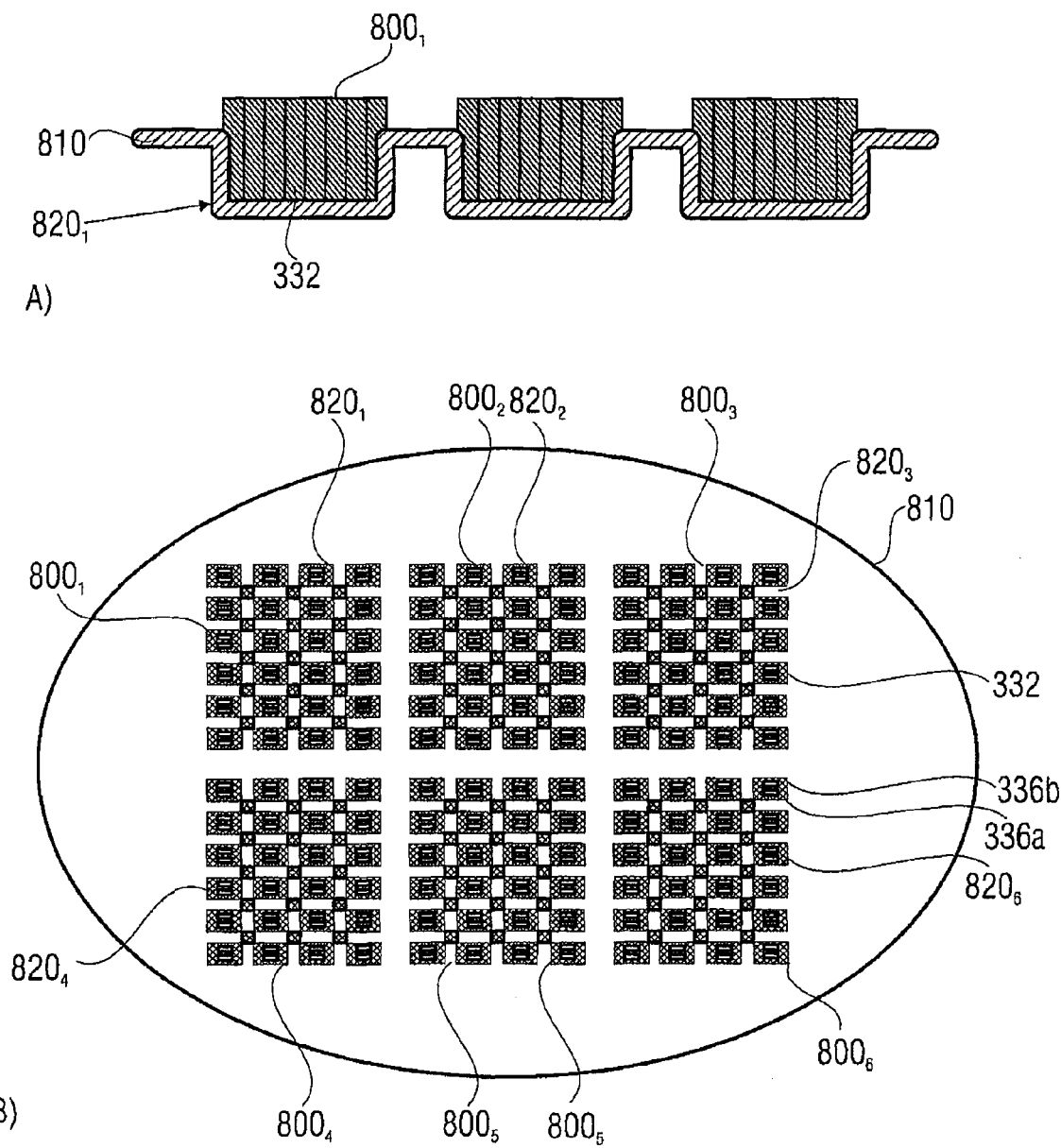
Figure 15:
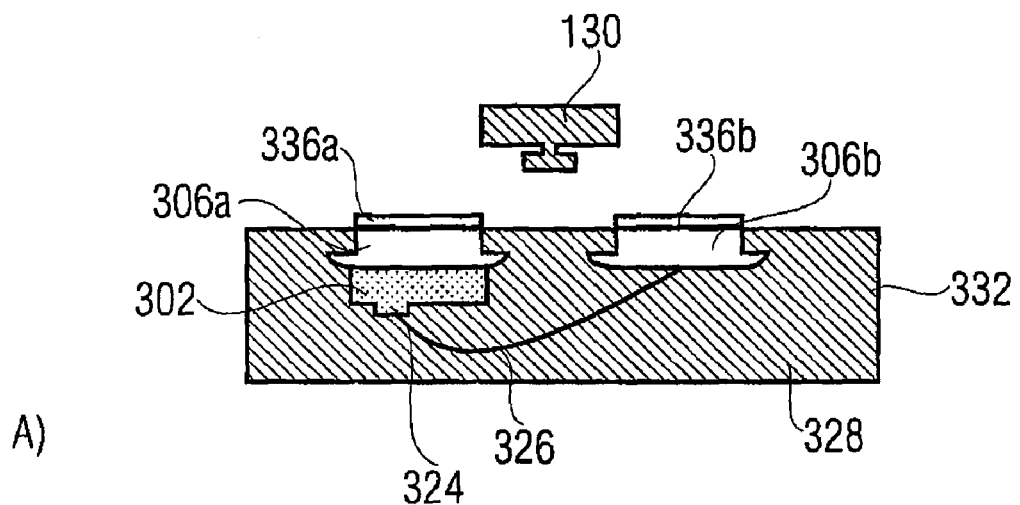
Figure 15:
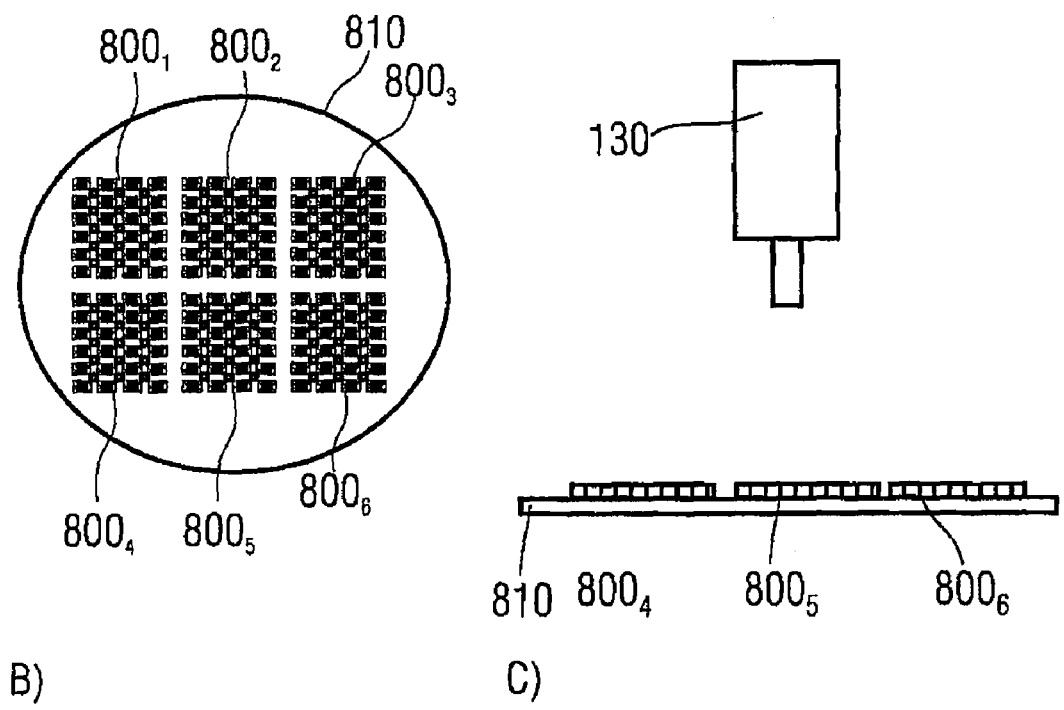

FIG. 6 shows examples of semiconductor devices being held after removal of a grid separator using different configurations of the bridges. The approach for obtaining the bridges is similar to the one describes in FIG. 5, however, the common walls of adjacent cavities are structured differently.

FIG. 6A is an isometric view of two adjacent semiconductor devices 332a and 332b, which are connected by a packaging material bridge 500. The package material bridge 500 shown in FIG. 6A may be obtained by lowering the height of an entire common wall 320 (see FIGS. 4 and 5) between adjacent cavities to the height $h_{CB}$ which is less than the first height $h_B$. The thickness of the package material bridge 420 is then approximately given by ($h_{SC}-h_{CB}$).

FIG. 6B is an isometric view of two adjacent semiconductor devices 332a and 332b, which are connected by a packaging material bridge 510. The package material bridge 510 shown in FIG. 6B may be obtained by lowering the height of first portions of a common wall 320 between adjacent cavities to the height $h_{CB}$. After removing the walls of the grid separator tray, the adjacent semiconductor devices 332a, 332b are held by a plurality of thin packaging material bridges 510 in a perforated manner. In addition, the common wall may be modified to have one or more first portions decreased by a first amount below the height $h_{sc}$ and one or more second portions decreased by a second amount below the height $h_{sc}$. The adjacent semiconductor devices 332a, 332b may then be held together by a packaging material bridge having ribs.

FIG. 6C shows a top view of three adjacent semiconductor devices 332a to 332c, which are connected by a packaging material bridge 520. The package material bridge 530 between the at least three adjacent semiconductor devices 332a, 332b, 332c, as shown in FIG. 6C, may be obtained according to a further embodiment, if a common wall of at least three adjacent cavities is lowered to the second height $h_{CB}$ in a predefined area around a common wall 320 of the at least three adjacent cavities of the grid separator tray.

The grid separator tray may be prefabricated on a leadframe, e.g. a copper leadframe. The grid separator tray may separate package units for several thousand dice, depending on the die size, wafer size and copper leadframe dimension. The embodiments, allow package units or semiconductor devices to be separated and eventually held together at the same time via the thin mold bridges explained above.

FIGS. 7 to 17 describe a further embodiment. To be more specific, FIGS. 7 to 17 describe details of an embodiment when using the copper separator tray 450 of FIG. 5 in the conventional process described with reference to FIG. 1.

FIG. 7A shows a cross-sectional view of a portion of the copper grid separator tray 450 of FIG. 5 prefabricated on a copper leadframe 300. Each cavity of the copper grid separator tray 450 has a structure as described with reference to FIG. 3. FIG. 7A shows the copper leadframe 300 with the walls 314 defining the cavity 316. On the leadframe 300 the Ni die pad 306a and the Ni contact pad 306b are provided. FIG. 7B shows a top view of the complete copper grid separator tray 450 with cavities 316 as shown in FIG. 7A.

FIG. 8A shows a cross-sectional view of the portion of the copper grid separator tray 450 as shown in FIG. 7A with a semiconductor element 322, e.g. a chip, attached (e.g. by bonding) to the die pad 306a. The chip 322 comprises a contact pad 324 on a surface of the chip 322 facing away from the leadframe 300. FIG. 8B shows a top view of the complete copper grid separator tray 450.

FIG. 9A shows a cross-sectional view of the portion of the copper grid separator tray 450 as shown in FIG. 8A with the semiconductor element 322 having connected to its die pad 306a a bond wire 326 for connection to the contact pad 306b. FIG. 9B shows a top view of the complete copper grid separator tray 450. The bond wire 108 may be made from gold, aluminum or copper.

FIG. 10A shows a cross-sectional view of the portion of the copper grid separator tray 450 as shown in FIG. 9A with the cavity 316 filled by a packaging material 328, e.g. by injection molding or resin dispensing. FIG. 10B shows a top view of the complete copper grid separator tray 450 with the packaging material bridges 480 between four adjacent cavities. The molding process is not limited to injection molding. Other techniques like transfer molding or compression molding may also be used. FIG. 10C shows a schematic representation of a machine for injection molding. The machine 600 comprises six nozzles 602 for dispensing respective streams 604 of packaging material. The machine 600 and the grid 450 are arranged relative to each other such that the nozzles may be is aligned with respective cavities 316 for introducing the material 605 into the cavities 316.

FIG. 11A shows a cross-sectional view of the portion of the copper grid separator tray 450 as shown in FIG. 10A with the packaging material 328 provided with a mark 700, e.g. by applying a laser marking process. FIG. 11B shows a top view of the complete copper grid separator tray 450 with each filled cavity bearing a mark 700. The mark may be an identification on the semiconductor device packages.

FIG. 12A shows a cross-sectional view of one of the plurality of semiconductor devices 332 produced after removal of the leadframe 300 and the copper grid separator tray 450 shown in FIG. 11A, e.g. by a copper etching process. Removing the copper leadframe 300 exposes the surfaces 334a and 334b of the Ni bumps 306a and 306b. FIG. 12B shows a top view of the plurality of semiconductor devices 332 with the walls of the copper grid separator tray etched away and held together by the thin mold bridges 480. FIG. 12C shows a bottom view of the plurality of semiconductor devices 332 with the walls of the copper grid separator tray etched away and held together by the thin mold bridges 480. Also the exposed surfaces 334a and 334b of the Ni bumps 306a and 306b are shown. The package material bridges 480 may have a thickness that is lower than the height $h_{SC}$ of the semiconductor packages 332.

FIG. 13A shows a cross-sectional view one of the plurality of semiconductor devices 332 shown in FIG. 12A with a gold layer 336a and 336b sputtered on the surfaces 334a and 334b of the Ni bumps 306a and 306b. FIG. 13B shows a top view of the plurality of semiconductor devices 332 with the walls of the copper grid separator tray etched away and held together by the thin mold bridges 480. FIG. 13C shows a bottom view of the plurality of semiconductor devices 332 with the walls of the copper grid separator tray etched away and held together by the thin mold bridges 480. Also the gold layers 336a and 336b are shown. The plurality of semiconductor devices 332 held together by the mold bridge 480 forms a block 800 of semiconductor devices 332.

To prepare the semiconductor packages for further processing, including visual inspection, the block 800 is assembled onto a metal ring slot plate 810 as shown in FIGS. 14A and 14B. The metal ring slot plate 810 comprises a plurality of metallic rectangular slots $820_1$ to $820_6$ for receiving a plurality of blocks $800_1$ to $800_6$. As can be seen, the blocks $800_1$ to $800_6$ are arranged in the metal ring such that the gold layers 336a and 336b are exposed.

Figure 1B:
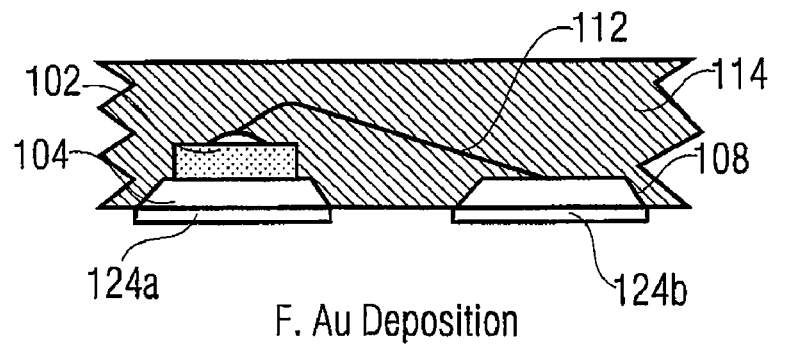
Figure 1B:
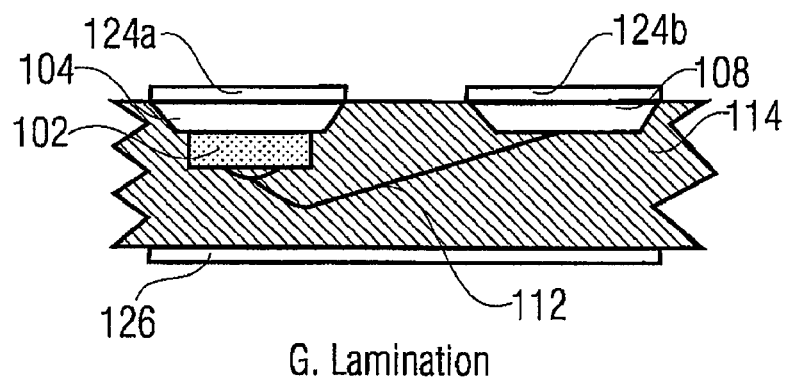
Figure 1B:
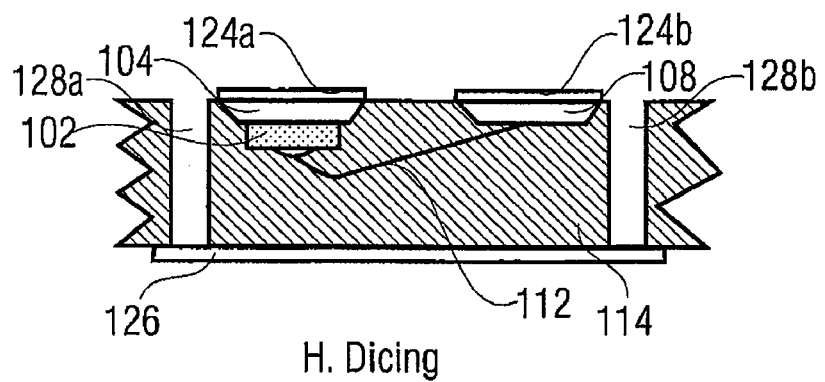
Figure 1B:
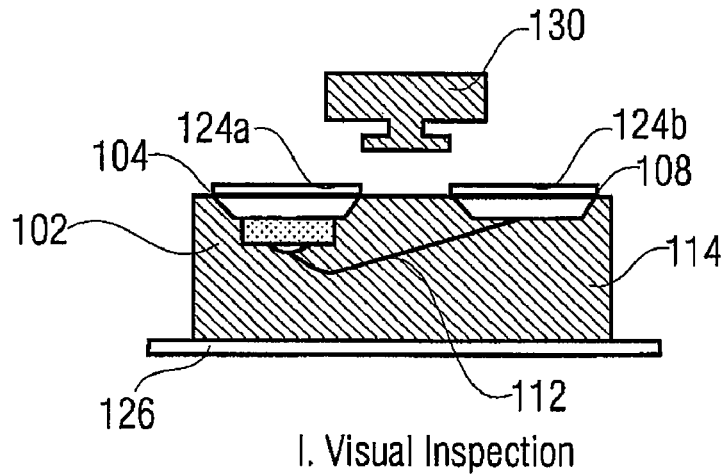
Figure 1C:
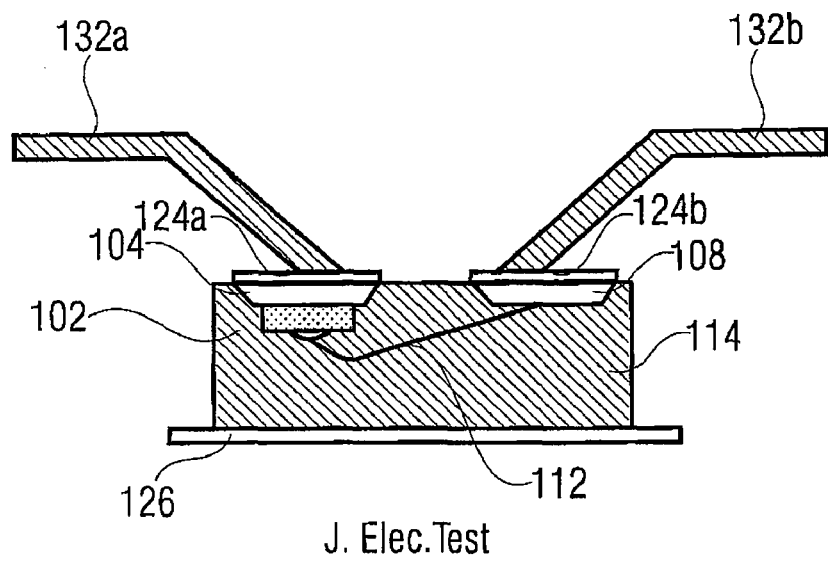
Figure 1C:
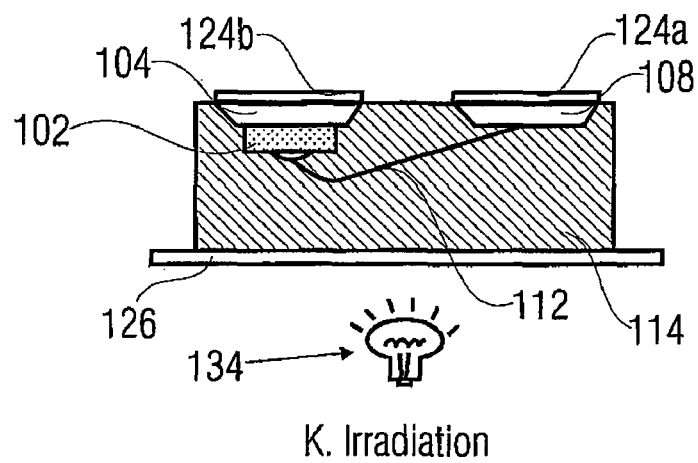
Figure 1C:
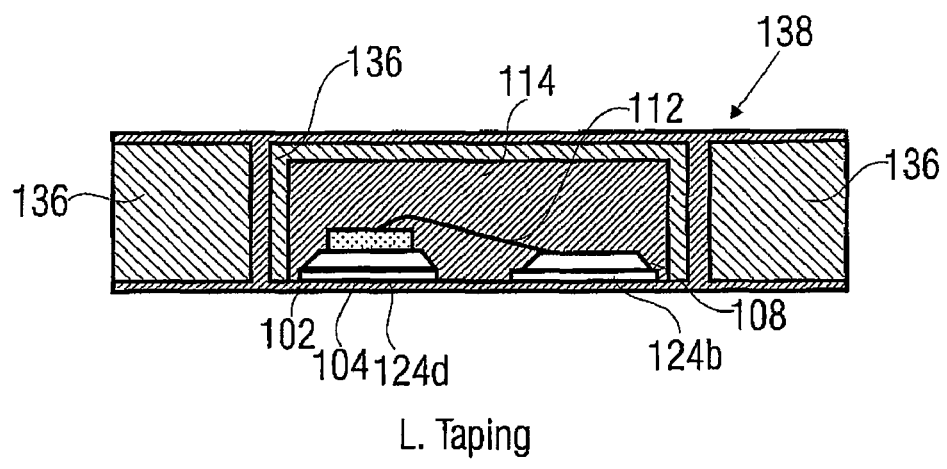

FIG. 15A shows the visual inspection of one device 332 by a camera 130 in a similar manner as in step I shown in FIG. 1B, except that due to the mold bridges not lamination tape was necessary. FIG. 15B shows the plurality of blocks $800_1$ to $800_6$ in the metal ring slot plate 810, and FIG. 15C shows the vision inspection of the plurality of semiconductor packages in the blocks $800_1$ to $800_6$.

Figure 16:
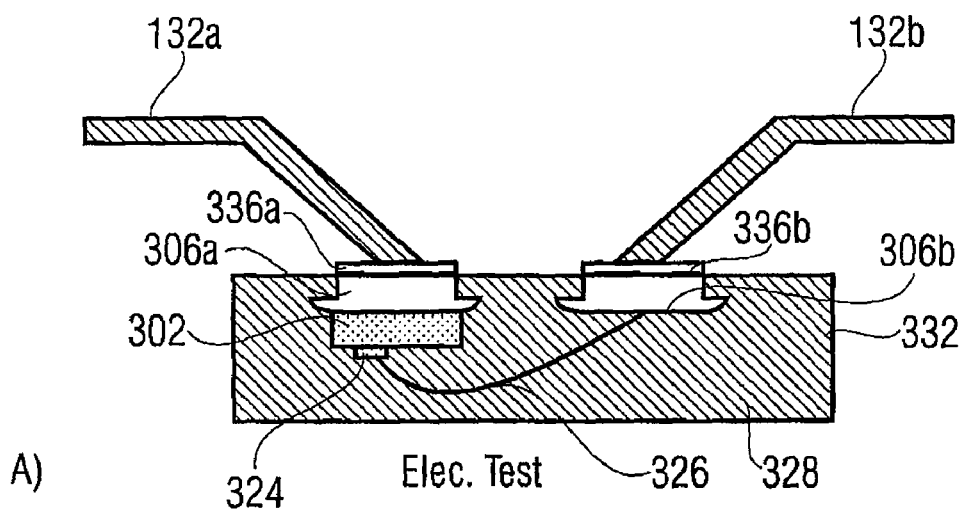
Figure 16:
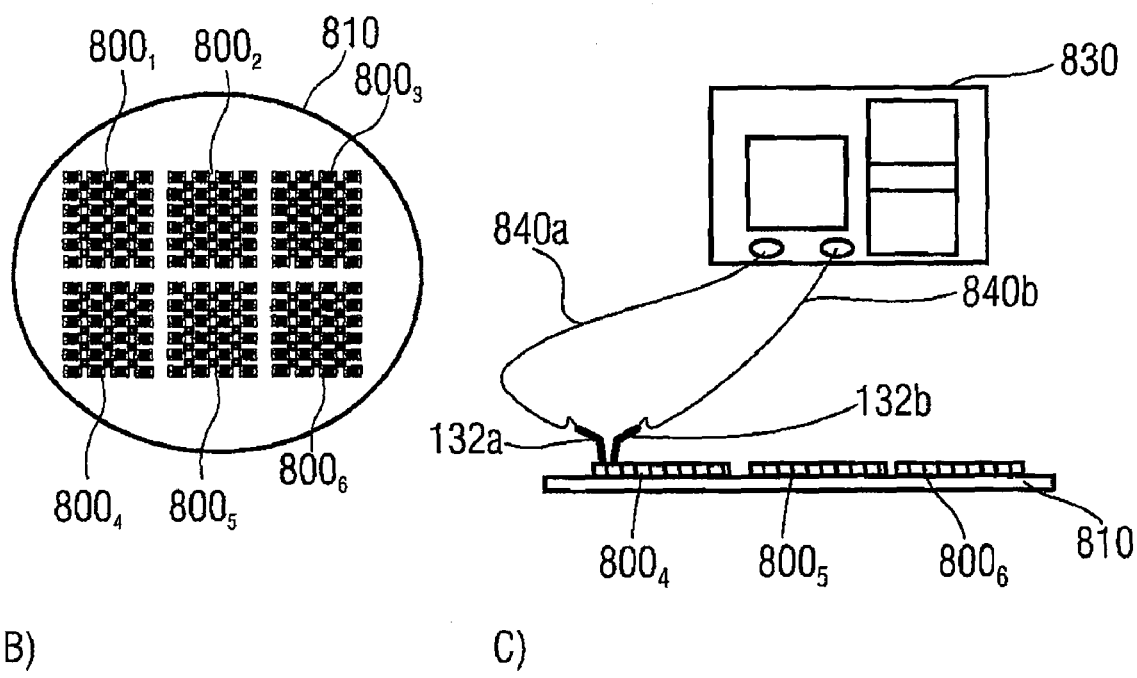

The vision inspection is followed by a step of electrical testing as is shown in FIG. 16. FIG. 16A shows the electrical testing of one device 332 by two probes 132a and 132b in a similar manner as in step J shown in FIG. 1C, again without lamination tape. FIG. 16B shows the plurality of blocks $800_1$ to $800_6$ in the metal ring slot plate 810, and FIG. 16C shows the test equipment 830 for performing the desired tests and being connected to the probes 132a and 132b via respective lines 840a, 840b for electrical testing the plurality of semiconductor packages in the blocks $800_1$ to $800_6$. The electrical testing of the semiconductor devices in large volumes may need to be done quickly and economically. Therefore the test equipment 830 may by an automated test system for mass testing.

Figure 17:
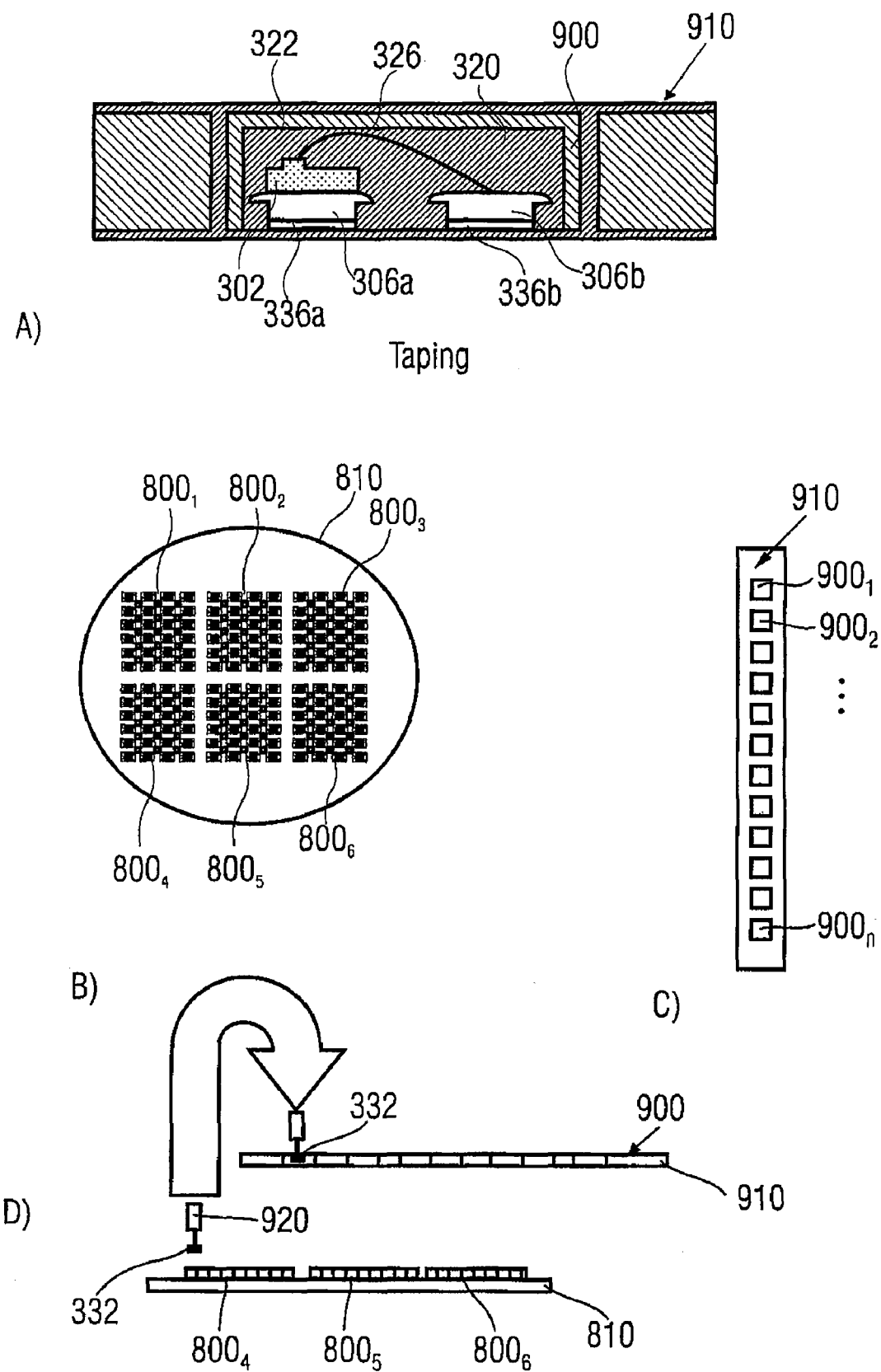

A final taping process in the fabrication of semiconductor devices is shown in FIG. 17. Taping is a process of packaging devices, e.g. surface mountable devices (SMD), by loading same into individual pockets 900 of a tape 910 a portion of which is shown in FIG. 17A. FIG. 17B shows the plurality of blocks $800_1$ to $800_6$ in the metal ring slot plate 810, and FIG. 17C shows a length of the tape 910 having the pockets $900_1$ to $900_n$. FIG. 17D schematically illustrates moving the devices 332 from the blocks $800_1$ to $800_6$ into the tape pockets 900. The individual semiconductor devices 332 are picked from the respective block $800_1$ to $800_6$ by a pickup collet 920. The pickup collet 920 will pick out the respective device 332 with a force sufficient to break the mold bridge. The mold bridges holding the semiconductor devices 332 together may by thin, i.e. their height may be between 5% and 10% of the height $h_{SC}$ of the semiconductor devices 332. Finally, the individual semiconductor devices are sealed in the tape 910 with a cover tape, e.g. by means of heat or pressure. The carrier tape 910 is then wound around a reel for convenient handling and transportation.

As can be seen from the above discussion given with reference to FIGS. 7 to 17 steps G, H and K, i.e. the steps of lamination, dicing, and UV irradiation, necessary in the conventional fabrication process described in FIG. 1 may be omitted. Expenses may be saved as there is no need for investments in lamination machines and machines for dicing and UV irradiation. At the same time, the fabrication procedure for semiconductor device packages may be accelerated. Furthermore, the quality of semiconductor device packages may be increased due to an improved finish of the packaging process. For example, dicing the chips by sawing may result in package cracking or chipping which may be avoided with the approach described above.

The embodiments may enable separating and eventually holding the plurality of semiconductor packages at the same time. According to the embodiments, the connection between the adjacent semiconductor packages may be obtained by thin mold bridges. The thin mold bridges may be obtained by the use of a grid separator tray.

The embodiments may further allow for saving the need in an investment in machinery for lamination, dicing, and/or UV irradiation. Further, the embodiments may allow for speeding up the production process of the semiconductor device packages. Further the separation or singulation of the semiconductor packages may lead to a higher quality and better finishing.

While the embodiments were described above using a grid separator having rectangular cavities it is noted that the cavities may have any desired form, e.g. dictated by the elements to be packaged or their use. The shape of the cavities may be polygonal, elliptic, or circular. The invention is not limited to the use of copper as a wall material. Any material which may be selectively etched with regard to the packaging material may be used.

While the embodiments were described above in which the walls are grown prior to arranging and contacting the semiconductor elements it is noted that the walls may also be formed after arranging and contacting the semiconductor elements on the leadframe. In this case also the already mounted elements may be masked, e.g. by a resist.

While the invention has been described in conjunction with a specific best mode, it is to be understood that many alternatives, modifications, and variations will be apparent to those skilled in the art in light of the foregoing description. Accordingly, it is intended to embrace all such alternative modifications and variations, which fall within the scope of the included claims.

What is claimed is:

1. A method comprising:
   providing a carrier comprising a plurality of cavities;
   placing at least one semiconductor element into each of the cavities;
   filling the plurality of cavities with a packaging material; and
   removing the carrier,
   wherein filling the plurality of cavities with the packaging material comprises filling the cavities such that the plurality of filled cavities are connected by the packaging material, and
   wherein providing a carrier comprises selectively growing a wall material of a common wall of adjacent cavities up to a first height and up to a second height, the second height being lower than the first height.

2. The method of claim 1, wherein forming the plurality of cavities comprises a process selected from the group consisting of a galvanic process, a deposition process, and a photolithographic process.

3. A method comprising:
   providing a carrier comprising a plurality of cavities;
   placing at least one semiconductor element into each of the cavities;
   filling the plurality of cavities with a packaging material; and
   removing the carrier,
   wherein filling the plurality of cavities with the packaging material comprises filling the cavities such that the plurality of filled cavities are connected by the packaging material, and
   wherein providing a carrier comprises growing a wall material of a common wall of adjacent cavities up to a first height, and selectively reducing the wall material from the first height to a second height.

4. A method comprising:
   providing a carrier comprising a plurality of cavities;
   placing at least one semiconductor element into each of the cavities;
   filling the plurality of cavities with a packaging material; and
   removing the carrier,
   wherein providing a carrier comprises growing a wall material of a common wall of adjacent cavities up to a first height, and selectively reducing the wall material from the first height to a second height;

wherein filling the plurality of cavities with the packaging material comprises filling the cavities such that the plurality of filled cavities are connected by the packaging material, and wherein selectively reducing the wall material comprises a process selected from the group consisting of a cutting process, a hammering process, and an etching process.

5. The method of claim 1, further comprising separating the filled cavities.

6. A method comprising:

providing a carrier comprising a plurality of cavities;

placing at least one semiconductor element into each of the cavities;

filling the plurality of cavities with a packaging material such that a plurality of adjacent filled cavities is connected by the packaging material;

removing the carrier; and separating the filled cavities;

wherein providing a carrier comprises selectively growing a wall material of a common wall of adjacent cavities by a galvanic process up to a first height and up to a second height, the second height being lower than the first height.

7. A method comprising:

providing a carrier comprising a plurality of cavities;

placing at least one semiconductor element into each of the cavities;

filling the plurality of cavities with a packaging material such that a plurality of adjacent filled cavities is connected by the packaging material;

removing the carrier; and separating the filled cavities;

wherein providing a carrier comprises growing a wall material of a common wall of adjacent cavities up to a first height, and selectively reducing the wall material from the first height to a second height.

8. The method of claim 5, wherein the carrier is a rigid member made from copper, and wherein removing the carrier comprises etching the carrier.

9. The method of claim 5, further comprising contacting the at least one semiconductor element arranged in each of the cavities.

* * * * *